United States Patent
Nogami et al.

(10) Patent No.: US 11,194,658 B2
(45) Date of Patent: Dec. 7, 2021

(54) SEMICONDUCTOR DEVICE AND SEMICONDUCTOR STORAGE DEVICE

(71) Applicant: Kioxia Corporation, Tokyo (JP)

(72) Inventors: Ryo Nogami, Sagamihara (JP);
Takahiro Fujiki, Kawasaki (JP);
Kosuke Morinaga, Yokohama (JP);
Naoki Wada, Yokohama (JP); Atsushi Takayama, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/117,492

(22) Filed: Dec. 10, 2020

(65) Prior Publication Data
US 2021/0294696 A1  Sep. 23, 2021

(30) Foreign Application Priority Data
Mar. 17, 2020 (JP) .............................. JP2020-046798

(51) Int. Cl.
*G06F 11/00* (2006.01)
*G06F 11/10* (2006.01)
(Continued)

(52) U.S. Cl.
CPC ..... *G06F 11/1068* (2013.01); *H03M 13/1102* (2013.01); *H03M 13/1515* (2013.01); *H03M 13/3746* (2013.01)

(58) Field of Classification Search
None
See application file for complete search history.

(56) References Cited

U.S. PATENT DOCUMENTS

| 7,600,177 B2 | 10/2009 | Qian et al. |
| 7,793,197 B2 | 9/2010 | Ito et al. |

(Continued)

FOREIGN PATENT DOCUMENTS

| JP | 2010-152960 A | 7/2010 |
| JP | 4598711 B2 | 12/2010 |

OTHER PUBLICATIONS

Y. Katayama and T. Yamane, "Concatenation of interleaved binary/nonbinary block codes for improved forward error correction," OFC 2003 Optical Fiber Communications Conference, 2003., 2003, pp. 391-393 vol. 1, doi: 10.1109/OFC.2003.1248290. (Year: 2003).*

*Primary Examiner* — Daniel F. McMahon
(74) *Attorney, Agent, or Firm* — Oblon, McClelland, Maier & Neustadt, L.L.P.

(57) ABSTRACT

A semiconductor device of an embodiment includes an ECC decoding processing circuit configured to perform ECC decoding on ECC frame data in a lateral direction of a product code frame, an RS decoding processing circuit configured to perform Reed-Solomon (RS) decoding on second frame data in a longitudinal direction of the product code frame, a memory M0 in which a syndrome generated for the ECC frame data decoded is stored, a memory M1 in which an RS syndrome generated for ECC frame data for which the ECC decoding has been successful is stored, and a memory D in which ECC frame data for which the ECC decoding has been failed is stored as frame data which cannot be corrected through decoding, and frame collection processing, and iterative correction processing of performing RS decoding on the uncorrected frame data collected in the frame collection processing are executed.

14 Claims, 22 Drawing Sheets

(51) Int. Cl.
*H03M 13/37* (2006.01)
*H03M 13/11* (2006.01)
*H03M 13/15* (2006.01)

(56) References Cited

U.S. PATENT DOCUMENTS

| | | | |
|---|---|---|---|
| 10,063,258 B2* | 8/2018 | Goldenberg | G06F 11/1076 |
| 11,101,823 B2* | 8/2021 | Imaizumi | G06F 11/1044 |
| 2011/0072331 A1* | 3/2011 | Sakaue | G06F 11/1012 |
| | | | 714/763 |
| 2015/0082128 A1* | 3/2015 | Kodavalla | H03M 13/1102 |
| | | | 714/774 |
| 2018/0034477 A1* | 2/2018 | Zamir | H03M 13/1108 |
| 2018/0175882 A1* | 6/2018 | Hanham | H03M 13/1111 |
| 2020/0089417 A1* | 3/2020 | Kifune | G11C 29/52 |

* cited by examiner

SEMICONDUCTOR DEVICE AND SEMICONDUCTOR STORAGE DEVICE

CROSS-REFERENCE TO RELATED APPLICATIONS

This application is based upon and claims the benefit of priority from the prior Japanese Patent Application No. 2020-46798 filed in Japan on Mar. 17, 2020, the entire contents of which are incorporated herein by reference.

FIELD

Embodiments described herein relate generally to a semiconductor device and a semiconductor storage device.

BACKGROUND

There is a case where a semiconductor storage device, or the like, includes an error correction circuit. While an error correction circuit for which error correction capability is improved by using a product code frame has been utilized, it is desired to further improve error correction capability.

DETAILED DESCRIPTION

A semiconductor device of an embodiment includes a first decoding circuit configured to perform first decoding on first frame data in a first direction of a product code frame, a second decoding circuit configured to perform second decoding on second frame data in a second direction of the product code frame, a first storage region in which a syndrome generated for the first frame data decoded at the first decoding circuit is stored, a second storage region in which the syndrome generated for the first frame data for which the first decoding is successful at the first decoding circuit is stored, and a third storage region in which the first frame data for which the first decoding is failed in the first decoding is stored as frame data which cannot be corrected through decoding, frame collection processing of collecting the frame data which cannot be corrected through decoding and iterative correction processing of performing the second decoding on the frame data which cannot be corrected through decoding and which is collected in the frame collection processing, being executed, in the frame collection processing, the first decoding being performed on the first frame data, and in a case where the first decoding is successful, the syndrome being generated for the first frame data for which the first decoding is successful and stored in the second storage region, and the syndrome generated for the first frame data regardless of whether the first decoding is successful or failed being stored in the first storage region, in the iterative correction processing, data correction being performed on the frame data which cannot be corrected through decoding, through the second decoding using the syndrome in the first storage region, the first decoding being performed on the frame data which cannot be corrected through decoding and which is corrected through the data correction, in a case where the first decoding on the frame data which cannot be corrected through decoding is successful, the frame data which cannot be corrected through decoding in the third storage region being updated, and the syndrome being generated for the frame data which cannot be corrected through decoding to update the first storage region and the second storage region, and in a case where the frame collection processing is performed after the iterative correction processing, data in the second storage region being copied to the first storage region.

Embodiments will be described below with reference to the drawings.

First Embodiment (Configuration)
(Configuration of Memory System)

Figure 1:
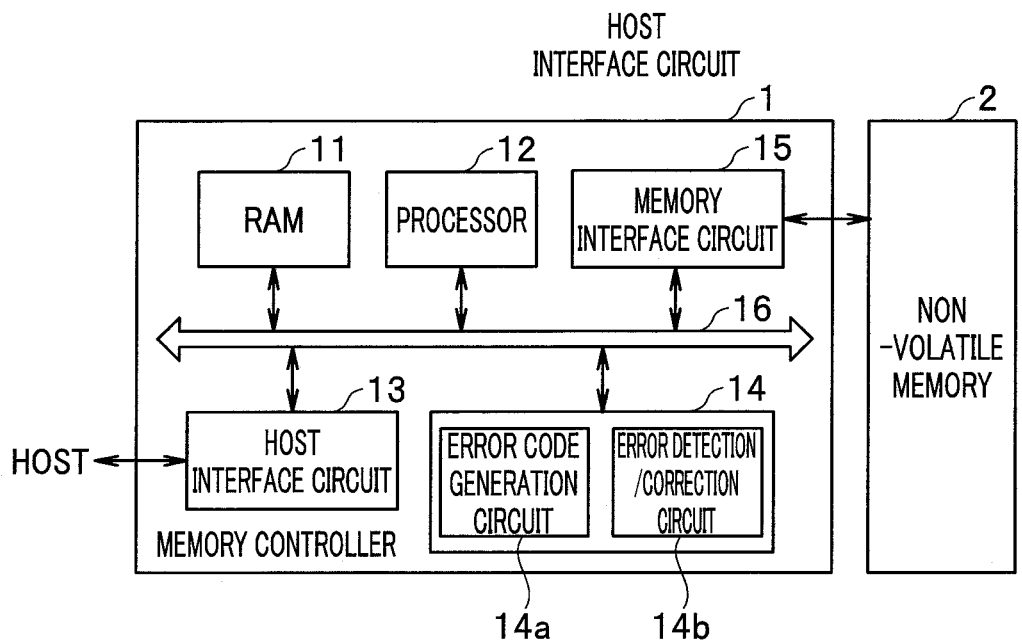
FIG. 1 is a block diagram illustrating a configuration example of a memory system according to a first embodiment.

FIG. 1 is a block diagram illustrating a configuration example of a memory system according to the embodiment. The memory system of the present embodiment includes a memory controller 1 and a non-volatile memory 2. The memory system can be connected to a host. The host is, for example, electronic equipment such as a personal computer, a mobile terminal and a smartphone.

The non-volatile memory 2 is a semiconductor memory which stores data in a non-volatile manner. For example, the non-volatile memory 2 includes a NAND flash memory. The present embodiment will be described assuming that the non-volatile memory 2 is a NAND memory having memory cells which can store 4 bits per memory cell, that is, a NAND memory of 4 bit/Cell (QLC (quad level cell)). The non-volatile memory 2 is constituted in three dimensions.

The memory controller 1 is a semiconductor device which controls writing of data in the non-volatile memory 2 in response to a write request from the host. A semiconductor package including the memory controller 1 and the non-volatile memory 2 constitutes a semiconductor storage device. Further, the memory controller 1 controls readout of data from the non-volatile memory 2 in response to a read request from the host. The memory controller 1 includes a RAM (random access memory) 11, a processor 12, a host interface circuit 13, an ECC (error check and correct) circuit 14, and a memory interface circuit 15. The RAM 11, the processor 12, the host interface circuit 13, the ECC circuit 14 and the memory interface circuit 15 are connected to one another with an internal bus 16.

The host interface circuit 13 outputs a request received from the host, write data which is user data, and the like, to the internal bus 16. Further, the host interface circuit 13 transmits user data read out from the non-volatile memory 2, a response from the processor 12, and the like, to the host.

The ECC circuit 14 includes an error code generation circuit 14a which generates an error correction code when user data is written in the non-volatile memory 2, and an error detection/correction circuit 14b which detects and corrects an error in user data read out from the non-volatile memory 2. The error code generation circuit 14a generates an error correction code for user data in response to an instruction from the processor 12. The processor 12 generates an error correction code for user data by the error code generation circuit 14a when the user data from the host is written in the non-volatile memory 2, and writes the user data to which the error correction code is added in the non-volatile memory 2. The processor 12 detects an error in user data from the non-volatile memory 2 by the error detection/correction circuit 14b when the user data is read out from the non-volatile memory 2 in response to a request from the host, corrects the data using the error correction code when the user data includes an error, and outputs the user data to the host.

The memory interface circuit 15 controls processing of writing user data, and the like, in the non-volatile memory 2 and processing of reading out user data, and the like, from the non-volatile memory 2 on the basis of the instruction from the processor 12.

The processor 12 controls the memory controller 1 comprehensively. The processor 12 is, for example, a CPU (central processing unit), or an MPU (micro processing unit). When the processor 12 receives a request from the host via the host interface circuit 13, the processor 12 performs control in response to the request. For example, the processor 12 instructs the memory interface circuit 15 to write user data and parity data in the non-volatile memory 2 in response to a request from the host. The parity data is generated by the error code generation circuit of the ECC circuit 14. Further, the processor 12 instructs the memory interface circuit 15 to read out user data and parity data from the non-volatile memory 2 in response to a request from the host. In a case where the readout user data includes an error, the data is corrected by the error detection/correction circuit 14b of the ECC circuit 14.

The processor 12 determines a storage region in the non-volatile memory 2, which is a write destination for each user data. A physical address is allocated to the storage region of the non-volatile memory 2. The processor 12 manages the storage region which is a write destination of the user data using the physical address. The processor 12 instructs the memory interface circuit 15 to designate the physical address of the determined storage region to write user data in the non-volatile memory 2. The processor 12 manages correspondence between a logical address (logical address managed by the host) and the physical address of the user data. In a case where the processor 12 receives a read request including a logical address from the host, the processor 12 specifies a physical address corresponding to the logical address and instructs the memory interface circuit 15 to read out user data while designating the physical address.

The RAM 11 temporarily stores the user data received from the host until the user data is stored in the non-volatile memory 2, or temporarily stores data read out from the non-volatile memory 2 until the data is transmitted to the host. The RAM 11 is, for example, a general-purpose memory such as an SRAM (static random access memory).

FIG. 1 illustrates a configuration example in which the memory controller 1 includes the ECC circuit 14 and the memory interface circuit 15. However, the ECC circuit 14 may be incorporated into the memory interface circuit 15. Further, the ECC circuit 14 may be incorporated into the non-volatile memory 2.

In a case where a write request is received from the host, the memory controller 1 operates as follows. The processor 12 causes write user data to be temporarily stored in the RAM 11. The processor 12 reads out the user data stored in the RAM 11 and inputs the user data to the ECC circuit 14. The error code generation circuit 14a of the ECC circuit 14 generates an error correction code (parity data) for the input data, and outputs the user data to which the error correction code is added to the memory interface circuit 15. The memory interface circuit 15 writes the user data to which the error correction code is added in the non-volatile memory 2.

In a case where a read request is received from the host, the memory controller 1 operates as follows. The memory interface circuit 15 outputs user data which is read out from the non-volatile memory 2 and to which the error correction code is added, to the ECC circuit 14. The error detection/correction circuit 14b of the ECC circuit 14 decodes the input user data, and in a case where an error is detected in the input user data, stores the data corrected using the error correction code in the RAM 11. The processor 12 transmits the user data stored in the RAM 11 to the host via the host interface circuit 13.

Figure 2:
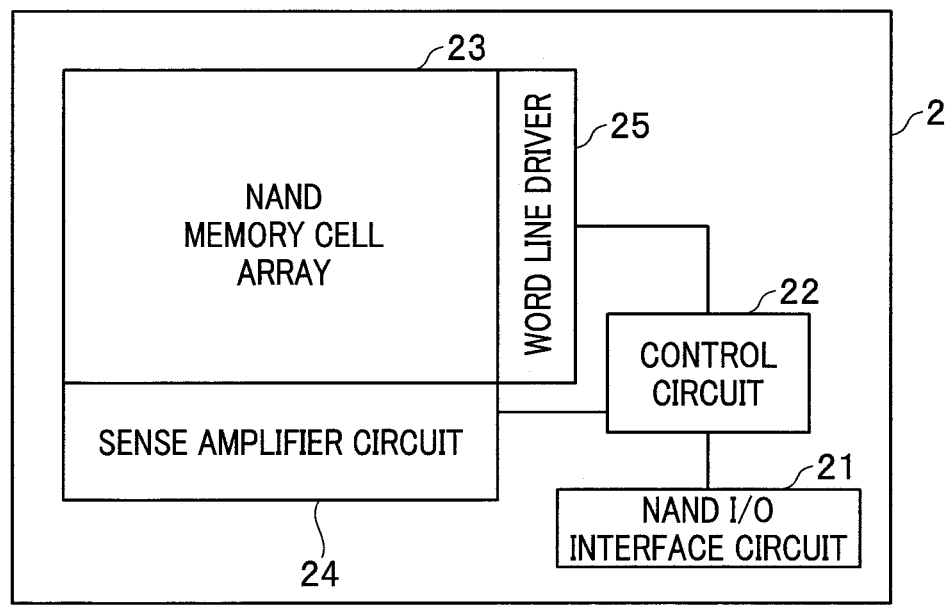
FIG. 2 is a block diagram illustrating a configuration example of a non-volatile memory according to the first embodiment.

FIG. 2 is a block diagram illustrating a configuration example of the non-volatile memory of the present embodiment. The non-volatile memory 2 includes a NAND I/O interface circuit 21, a control circuit 22, a NAND memory cell array 23, a sense amplifier circuit 24, and a word line driver 25. The non-volatile memory 2 includes, for example, a one-chip semiconductor substrate (for example, a silicon substrate).

The NAND I/O interface circuit 21 receives a control signal such as a write enable signal WEn, a read enable signal REn, an address latch enable signal ALE and a command latch enable signal CLE, output from the memory controller 1. Further, the NAND I/O interface circuit 21 receives a command, an address and data output from the memory controller 1.

The control circuit 22 receives a control signal, a command, an address and data from the NAND I/O interface circuit 21 and controls operation of the non-volatile memory 2 on the basis of the control signal, the command, the address and the data. The control circuit 22, for example, controls the word line driver 25 and the sense amplifier circuit 24 on the basis of the control signal, the command, the address and the data and executes write operation, read operation, erase operation, and the like.

In a case where a write command is input, the control circuit 22 controls the sense amplifier circuit 24 and the word line driver 25 so as to write data input in association with the write command in the address designated on the NAND memory cell array 23. Further, in a case where a read command is input, the control circuit 22 controls the sense amplifier circuit 24 and the word line driver 25 so as to read out data from the address designated on the NAND memory cell array 23.

For example, the control circuit 22 controls voltages to be applied to a plurality of word lines WL by the word line driver 25 and voltages (bit line voltages) to be applied to a plurality of bit lines BL by the sense amplifier circuit 24 so as to write data in a memory cell (memory cell transistor) MT included in the NAND memory cell array 23.

The sense amplifier circuit 24 is configured to be able to apply voltages (or currents) to a plurality of bit lines BL independently of each other and detect voltages (or currents) of a plurality of bit lines BL independently of each other.

The word line driver 25 is configured to be able to apply voltages to a plurality of word lines and select gate lines independently of each other.

(Configuration of NAND Memory Cell Array)

Figure 3:
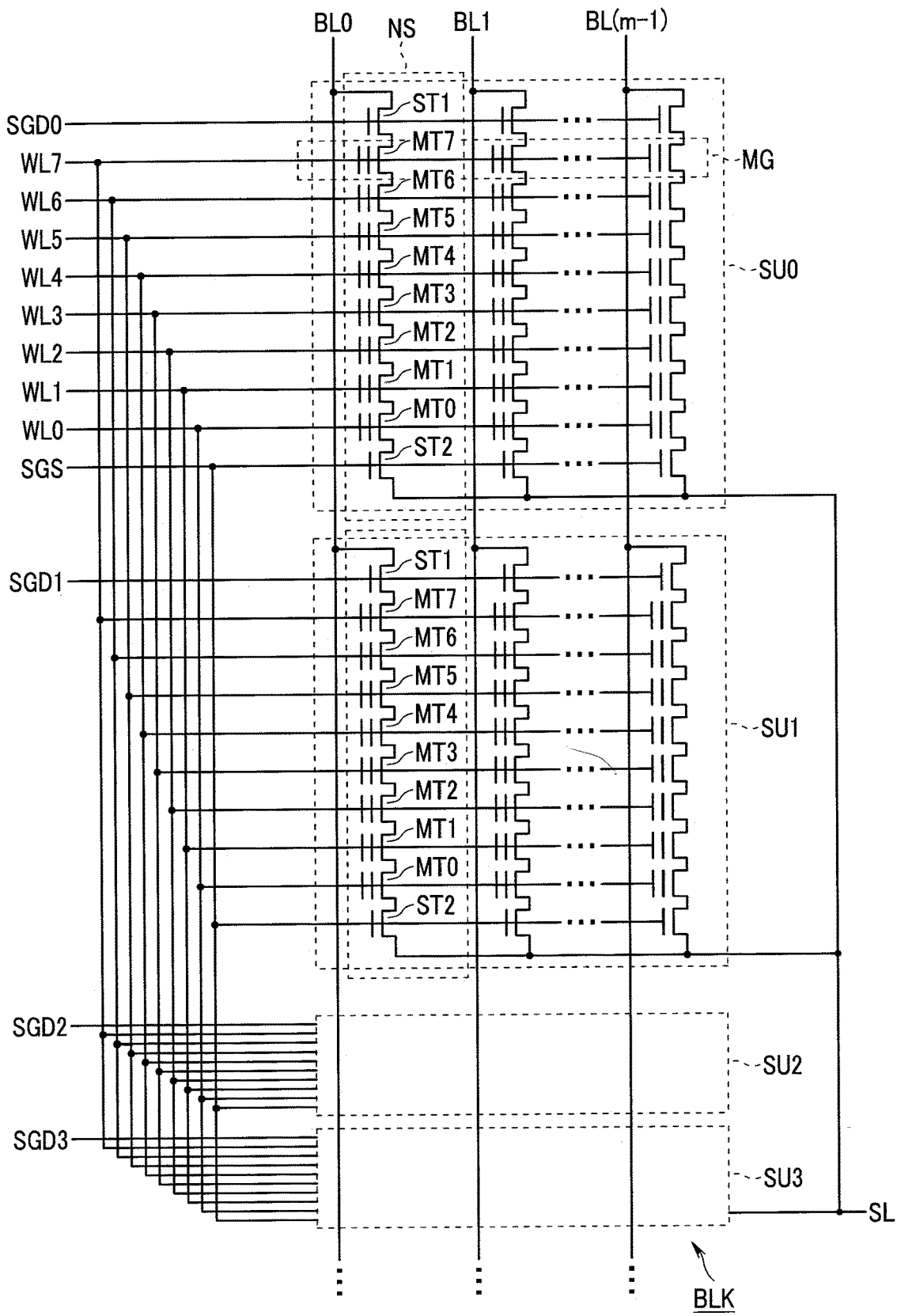
FIG. 3 is a view illustrating a configuration example of a block of a NAND memory cell array having a three-dimensional structure according to the first embodiment.

FIG. 3 is a view illustrating a configuration example of a block of the NAND memory cell array 23 having a three-dimensional structure. FIG. 3 illustrates one block BLK among a plurality of blocks which constitute the NAND memory cell array (hereinafter, referred to as a memory cell array) 23 having a three-dimensional structure. Other blocks of the memory cell array have configurations similar to the configuration illustrated in FIG. 3. Note that the present embodiment can also be applied to a memory cell array having a two-dimensional structure.

As illustrated in FIG. 3, the block BLK includes, for example, four string units (SU0 to SU3). Further, each string unit SU includes a plurality of NAND strings NS. Each of the NAND strings NS includes eight memory cells MT (MT0 to MT7) and select transistors ST1 and ST2 here. Note that while the number of the memory cells MT included in the NAND string NS is eight here, the number is not limited to eight, and, for example, the number of the memory cells MT included in the NAND string NS may be, but is not limited to, 32, 48, 64 or 96. While the select transistors ST1 and ST2 are illustrated as one transistor on an electric circuit, the select transistors ST1 and ST2 may have the same structure as the structure of the memory cell transistor. Further, a plurality of select transistors may be respectively used as the select transistors ST1 and ST2 to improve, for example, cut-off characteristics. Still further, dummy cell transistors may be provided between the memory cells MT and the select transistors ST1 and ST2.

The memory cells MT are disposed so as to be connected in series between the select transistors ST1 and ST2. The memory cell MT7 on one end side is connected to the select transistor ST1, and the memory cell MT0 on the other end side is connected to the select transistor ST2.

Gates of respective select transistors ST1 of the string units SU0 to SU3 are respectively connected to the select gate lines SGD0 to SGD3. On the other hand, gates of the select transistors ST2 of a plurality of string units SU within the same block BLK are commonly connected to the same select gate line SGS. Further, gates of the memory cells MT0 to MT7 within the same block BLK are respectively commonly connected to the word lines WL0 to WL7. In other words, while the word lines WL0 to WL7 and the select gate line SGS are commonly connected among the plurality of string units SU0 to SU3 within the same block BLK, the select gate lines SGD are independent for each of the string units SU0 to SU3 even within the same block BLK.

The word lines WL0 to WL7 are respectively connected to the gates of the memory cells MT0 to MT7 which constitute the NAND string NS. Gates of the memory cells MTi in the same row within the block BLK are connected to the same word line WLi. Note that in the following description, there is a case where the NAND string NS will be simply referred to as a "string".

Each NAND string NS is connected to the corresponding bit line. Thus, each memory cell MT is connected to a bit line via the select transistor ST and other memory cells MT included in the NAND string NS. As described above, data in the memory cells MT within the same block BLK is collectively erased. On the other hand, data is read out and written in units of memory cell groups MG (or in units of pages). In the present specification, a plurality of memory cells MT which are connected to one word line WLi and which belong to one string unit SU are defined as a memory cell group MG. In the present embodiment, the non-volatile memory 2 is a NAND memory of a QLC (quad level cell) which is capable of storing data of four bits (16 values).

(Configuration of Product Code)

Correction capability of the ECC circuit 14 of the memory controller 1 in the NAND memory is improved by using a product code frame. The product code frame includes ECC parity data (error correction code) in a bit (column) direction and Reed-Solomon (hereinafter, abbreviated as RS) parity data (error correction code) in a longitudinal direction. The ECC parity data and the RS parity data are generated by the error code generation circuit 14a of the ECC circuit 14 and added to the user data.

Figure 4:
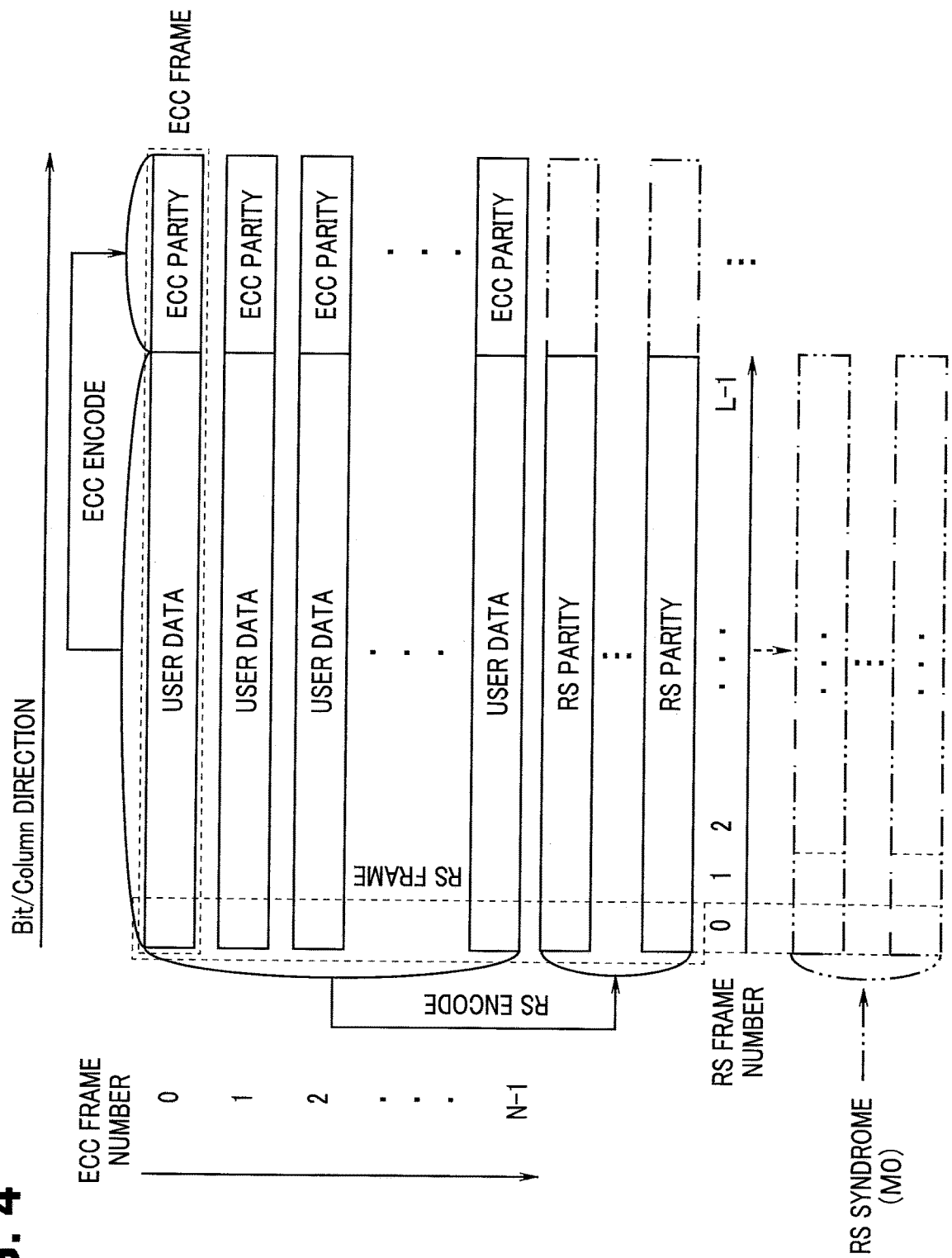
FIG. 4 is a configuration diagram of a product code frame according to the first embodiment.

FIG. 4 is a configuration diagram of the product code frame. The user data includes data of a plurality of rows (here N rows, where N is a positive integer) and a plurality of columns (here, M columns, where M is a positive integer). The ECC parity data is added in a lateral direction (bit (column) direction) and the RS parity data is added in a longitudinal direction for each row of the user data. The ECC parity data is generated by ECC encoding being performed in a lateral direction at the error code generation circuit 14a. The RS parity data is generated by RS encoding being performed in a longitudinal direction at the error code generation circuit 14a.

The ECC parity data is generated on the basis of a BCH (Bose-Chaudhuri-Hocquenghem) coding scheme, an LDPC (low density parity check) scheme, or the like.

Note that while the ECC encoding scheme is used for data in a lateral direction here, parity data in a row direction may be generated using other encoding schemes. In a similar manner, while the RS encoding scheme is used for data in a longitudinal direction here, parity data in a longitudinal direction may be generated using other encoding schemes.

Data including user data of one row and the ECC parity data added to the row in the lateral direction in FIG. 4 will be referred to as an ECC frame. The user data of a plurality of rows is divided into a plurality of columns by each row of the user data being separated, for example, for each byte in predetermined units of data. Data including user data of one column having a predetermined data width in a longitudinal direction in FIG. 4 and two pieces of RS parity data added to the column will be referred to as an RS frame. In other words, a frame in a lateral direction will be referred to as an ECC frame, and a frame in a longitudinal direction will be referred to as an RS frame. In FIG. 4, a frame including N ECC frames and L RS frames will be referred to as a product code frame.

An RS syndrome which will be described later is generated for the ECC frame and stored in the memory M0 upon RS decoding as indicated with a dashed-two dotted line in FIG. 4. The number of bits of each RS syndrome is the same as the number of bits of the RS parity data divided for each RS frame.

Note that while one piece of ECC parity data is added to the user data of one row, the user data of one row may be divided into a plurality of (for example, four) pieces, and one piece of parity data may be added for each piece of divided partial user data. For example, if the user data of one row is divided into four pieces, four pieces of parity data are generated.

Further, note that while the RS parity data is added only to the user data here as illustrated in FIG. 4, as indicated with a dashed-two dotted line, the RS parity data may also be added to the ECC parity data.

In the following description, description regarding a method for writing user data will be omitted, and a method for decoding user data, that is, a method for reading out and correcting user data will be described. Here, processing of decoding a product code frame of user data will be described.

COMPARATIVE EXAMPLE

A decoding method as a comparative example of the present embodiment will be described first before the decoding method of the present embodiment is described.

Figure 5:
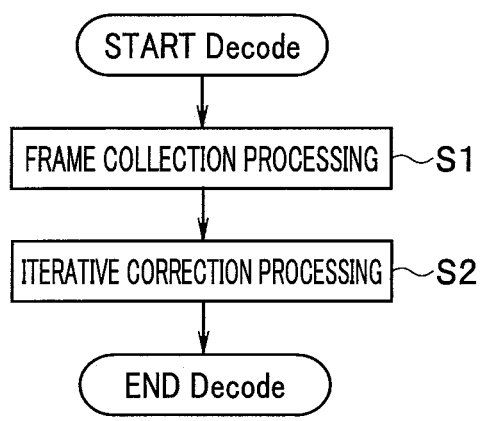
FIG. 5 is a flowchart illustrating entire flow of processing of decoding a product code frame of user data stored in a non-volatile memory according to a comparative example.

FIG. 5 is a flowchart illustrating entire flow of processing of decoding a product code frame of user data stored in the non-volatile memory 2 according to the comparative example. In the decoding processing, in a case where a read request is received from the host, the processor 12 controls the memory interface circuit 15 to read out user data from a physical address regarding the request from the non-volatile memory 2. The user data of the product code frame as illustrated in FIG. 4 is read out from the non-volatile memory 2 and stored in a predetermined storage region in the RAM 11.

In the decoding processing, in a case where the user data read out from the non-volatile memory 2 does not include an error, the processor 12 sends the user data to the host. In a case where the user data read out from the non-volatile memory 2 includes an error, the processor 12 corrects the user data and returns the corrected user data to the host. The processor 12 performs processing of decoding the user data read out from the non-volatile memory 2 while controlling the ECC circuit 14.

In the decoding processing, first, frame collection processing is performed (step (hereinafter, abbreviated as S) 1), and then, iterative correction processing is executed (S2). In the frame collection processing, ECC frames for which decoding has been failed through ECC decoding processing in which error correction is performed in units of bits (that is, ECC frames which could not be corrected through ECC), are collected. In other words, in the frame collection processing, ECC frames for which it is necessary to correct data through RS decoding are collected. In the RS decoding, error correction is performed in units of symbols. In the iterative correction processing, RS decoding processing is executed on the ECC frames collected in S1.

Figure 6:
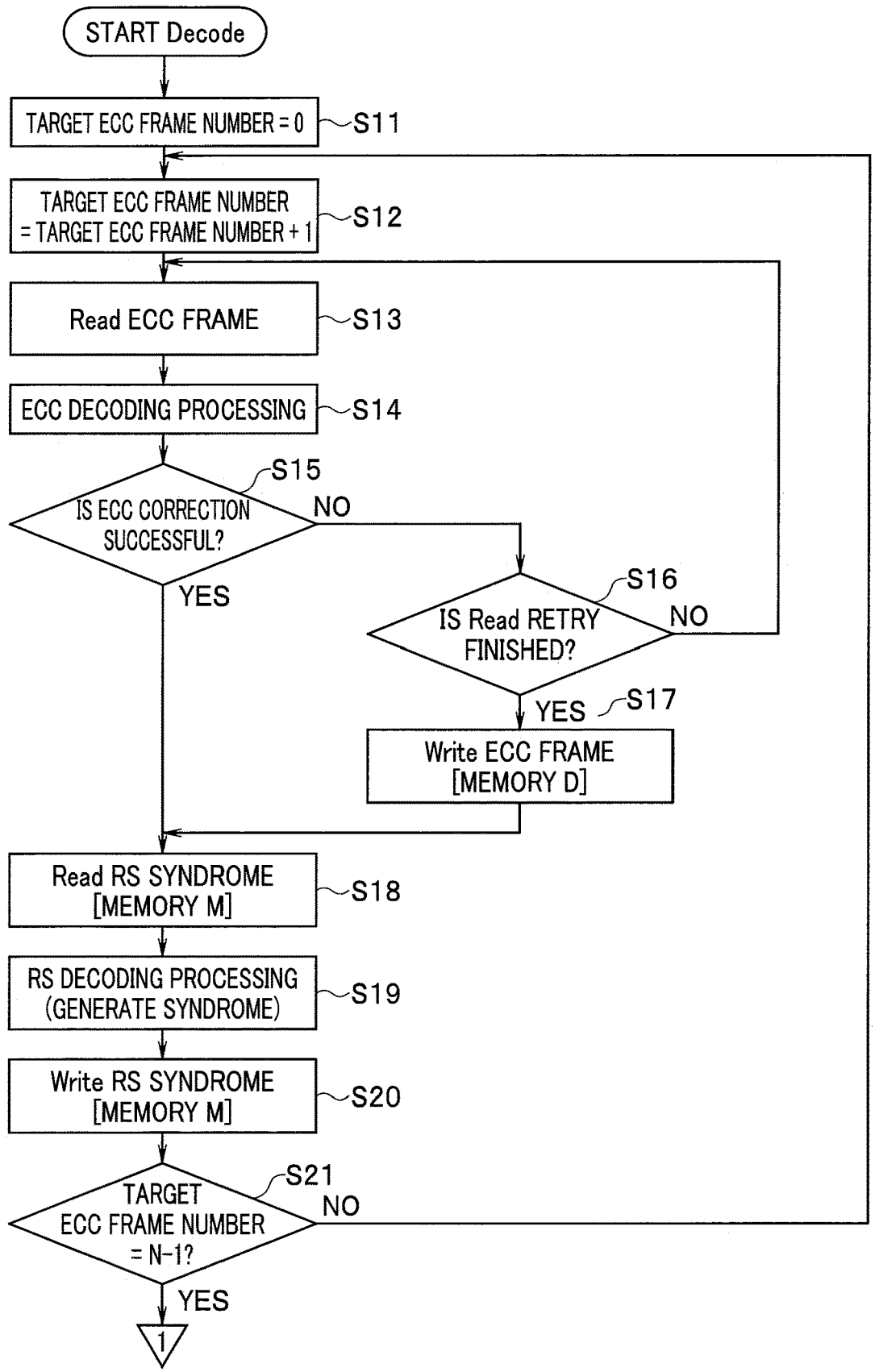
FIG. 6 is a flowchart illustrating an example of flow of frame collection processing according to the comparative example.
Figure 7:
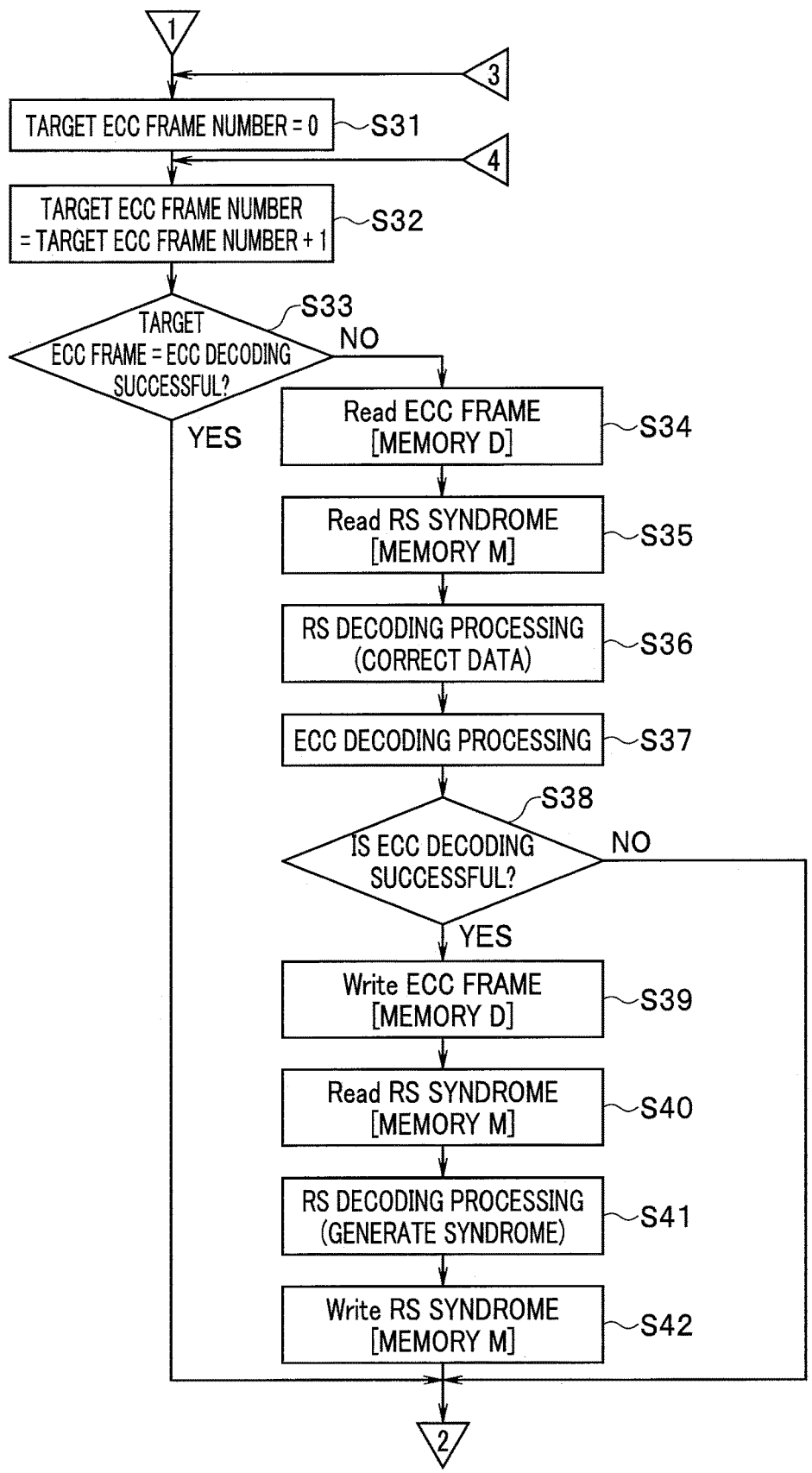
FIG. 7 is a flowchart illustrating an example of flow of iterative correction processing according to the comparative example.
Figure 8:
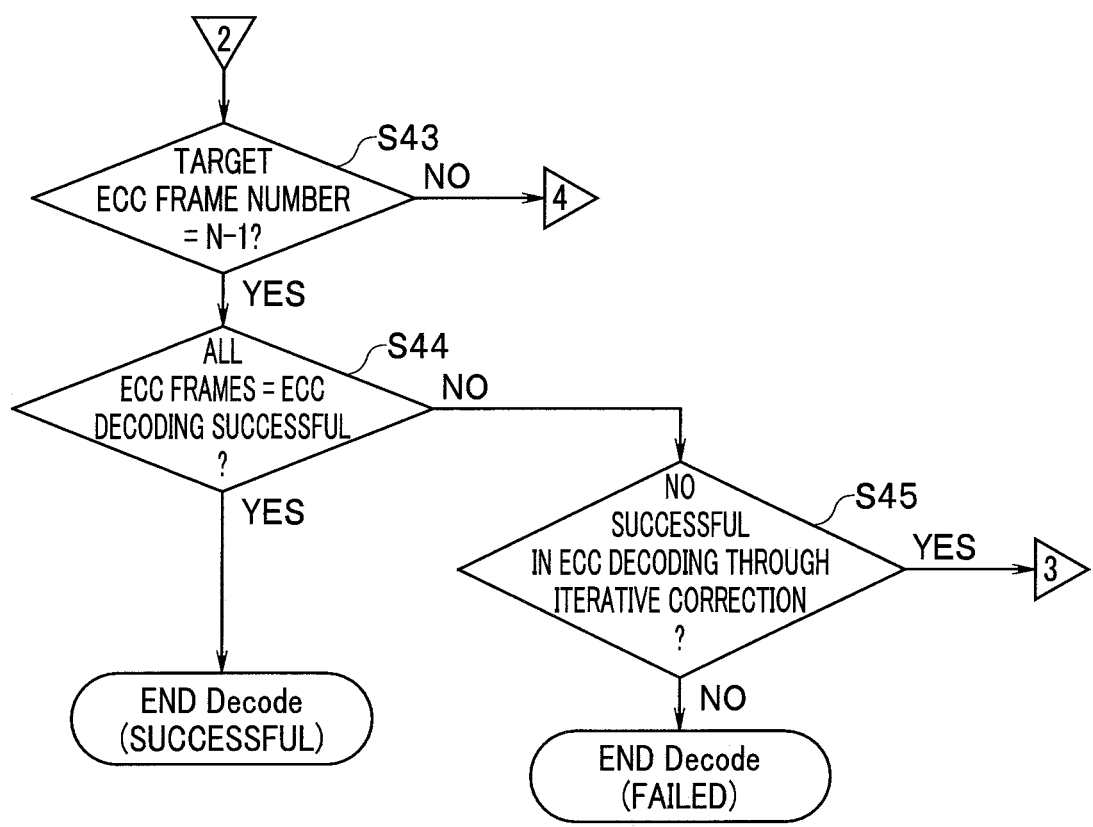
FIG. 8 is a flowchart illustrating an example of flow of the iterative correction processing according to the comparative example.

FIG. 6 is a flowchart illustrating an example of flow of the frame collection processing. FIG. 7 and FIG. 8 are flowcharts illustrating an example flow of the iterative correction processing.

The processor 12 of the memory controller 1 sets a frame number of the ECC frame which is an ECC target at "0" (S11), and, then, increments the frame number by "1" (S12).

The processor 12 reads out the target ECC frame of the set frame number (S13). After S13, the processor 12 executes ECC decoding processing by providing a signal for causing the error detection/correction circuit 14b to execute ECC decoding processing (S14). In S14, the error detection/correction circuit 14b detects whether the readout target ECC frame includes an error, and, in a case where the readout target ECC frame includes an error, executes error correction through ECC.

The processor 12 determines whether ECC correction by the error detection/correction circuit 14b has been successful in a case where the target ECC frame has been correctly read out or the target ECC frame includes an error (S15).

The error detection/correction circuit 14b decodes the frame and generates a flag indicating whether or not the frame could be correctly decoded as internal data. More specifically, the error detection/correction circuit 14b executes ECC correction processing in a case where the frame could not be correctly decoded, and generates a flag indicating whether ECC correction could be correctly performed as internal data. The processor 12 can therefore determine whether ECC correction has been successful by reading out the flag generated by the error detection/correction circuit 14b.

In a case where ECC correction has not been successful (S15: No), the processor 12 determines whether a predetermined number of times of retry of readout have been finished (S16). In a case where the predetermined number of times of retry of readout have not been finished (S16: No), the processing returns to S13, and the processing from S13 to S15 is executed again. Note that upon retry, an ECC frame may be read out while changing a readout condition by shift read, and the like.

In a case where the predetermined number of times of retry of readout are finished (S16: YES), the processor 12 writes the ECC frame which could not be corrected through ECC in a memory D (S17). The memory D is, for example, a predetermined storage region in the RAM 11.

Note that the processor 12 writes a determination result in S15 in a predetermined storage region (or a predetermined register) in the RAM 11 so that the processor 12 can determine decoding of which ECC frame has been successful or failed. For example, determination result data indicating an ECC frame which has been correctly read out or which could be corrected through ECC as "0" and indicating an ECC frame which could not be corrected through ECC as "1" is written in the predetermined storage region (or the predetermined register) in the RAM 11.

In a case where ECC correction has been successful in S15, after the ECC frame which could not be corrected through ECC is written in the memory D in S17, an RS syndrome is read out from a memory M (S18). The memory M is a predetermined storage region in the RAM 11. Note that the RS syndrome which is read out from the memory M for the first time is "0".

The processor 12 generates an RS syndrome from the target ECC frame decoded in S14 and the RS syndrome in the memory M after S18 (S19). The processor 12 writes the syndrome generated in S19 in the memory M (that is, updates the syndrome) (S20). The processor 12 updates the RS syndrome by adding the generated RS syndrome to the RS syndrome read out in S18 (S20).

The processor 12 determines whether the target ECC frame number becomes (N−1) (S21). In other words, the processor 12 determines whether the above-described processing from S13 to S20 has been performed for all the ECC frames of N rows.

In a case where the processing from S13 to S20 has not been completed for the ECC frames of N rows, the processing returns to S12, and the ECC frame number is incremented, and the processing in S13 and subsequent processing are executed.

In a case where the processing from S13 to S20 has been performed for all the ECC frames of N rows, the processor 12 executes the iterative correction processing in FIG. 7.

As described above, the processing in FIG. 6 is finished. As a result, information of the ECC frames which could not be corrected through ECC is written in the memory D.

The processor 12 sets the frame number of the target ECC frame at "0" (S31) and increments the frame number by "1" (S32).

The processor 12 determines whether the target ECC frame is a frame for which ECC decoding has been successful on the basis of the determination result data in S15 (S33). In other words, the processor 12 determines whether or not the target ECC frame has been correctly read out or has been correctly corrected through ECC by referring to the above-described predetermined storage region (or the predetermined register) in the RAM 11.

In a case where the target ECC frame is a frame which could be decoded through ECC, that is, a frame for which ECC decoding has been successful, the processing proceeds to S43, and in a case where the target ECC frame is a frame which could not be decoded through ECC, the processing from S34 to S42 is executed.

In a case where the target ECC frame is a frame which could not be decoded through ECC, that is, a frame for which ECC decoding has not been successful (S33: NO), the processor 12 reads out the ECC frame of the target ECC frame from the memory D (S34) and reads out the RS syndrome from the memory M (S35).

The processor 12 performs RS decoding processing, that is, data correction processing on the target ECC frame read out in S35 using the RS syndrome read out in S35 for the user data (S36). Data of the target ECC frame read out in S34 may be corrected through the processing in S36, and thus, ECC decoding processing is executed on the target ECC frame (S37).

After S37, the processor 12 determines whether ECC decoding on the target ECC frame has been successful as a result of the ECC decoding processing by the error detection/correction circuit 14b (S38). The processor 12 updates the determination result data in the predetermined storage region (or the predetermined register) in the RAM 11 on the basis of a determination result in S38.

In a case where ECC decoding on the target ECC frame has been successful (S38: YES), the processor 12 writes the target ECC frame in the memory D (S39). In a case where ECC decoding has been successful in S38, the processor 12 writes the target ECC frame which has been successfully decoded in the memory D (that is, erases the decoded target ECC frame data from the memory D), and then, reads out the RS syndrome from the memory M (S40).

The processor 12 generates an RS syndrome from the target ECC frame which has been successfully decoded and the RS syndrome in the memory M after S40 (S41).

The processor 12 writes the syndrome generated in S41 in the memory M (that is, updates the syndrome) (S42).

In a case where the determination result in S33 is YES, or after S42, the processor 12 determines whether the ECC frame number becomes (N−1) (S43). In other words, the processor 12 determines whether the above-described processing from S33 to S42 has been performed for all the ECC frames of N rows.

In a case where the processing from S33 to S42 has not been completed for the ECC frames of N rows, the processing returns to S32, the target ECC frame number is incremented, and the processing in S33 and subsequent processing are executed.

In a case where the determination result in S43 is YES, that is, in a case where the processing from S33 to S42 has been performed for all the ECC frames of N rows, the processor 12 determines whether ECC decoding has been successful for all the ECC frames (S44). The determination in S44 is performed by referring to the predetermined storage region (or the predetermined register) in the RAM 11 as described above.

In a case where ECC decoding has been successful for all the ECC frames (S44: YES), the decoding processing is finished.

In a case where ECC decoding has not been successful for any one of the ECC frames (S44: NO), the processor 12 determines whether none of the ECC frames has been successfully decoded through ECC in the above-described iterative correction processing from S31 to S43 (S45). The determination in S45 is performed on the basis of whether or not the determination result in S38 has become YES.

In a case where at least one of the ECC frames has been successfully decoded through ECC (S45: YES), the processing returns to S31, and the above-described processing is executed again.

In other words, the user data could be decoded through ECC as a result of RS decoding, and thus, it is tried again whether ECC decoding is successful through RS decoding on the basis of the newly decoded user data. The processing from S31 to S43 is executed until none of the ECC frames is decoded through ECC by iterative correction.

In a case where none of the ECC frames has been successfully decoded through ECC (S45: NO), the processing is finished. In a case where the processing is finished, a message, or the like, indicating that the decoding processing has been failed is transmitted to the processor 12.

Figure 9:
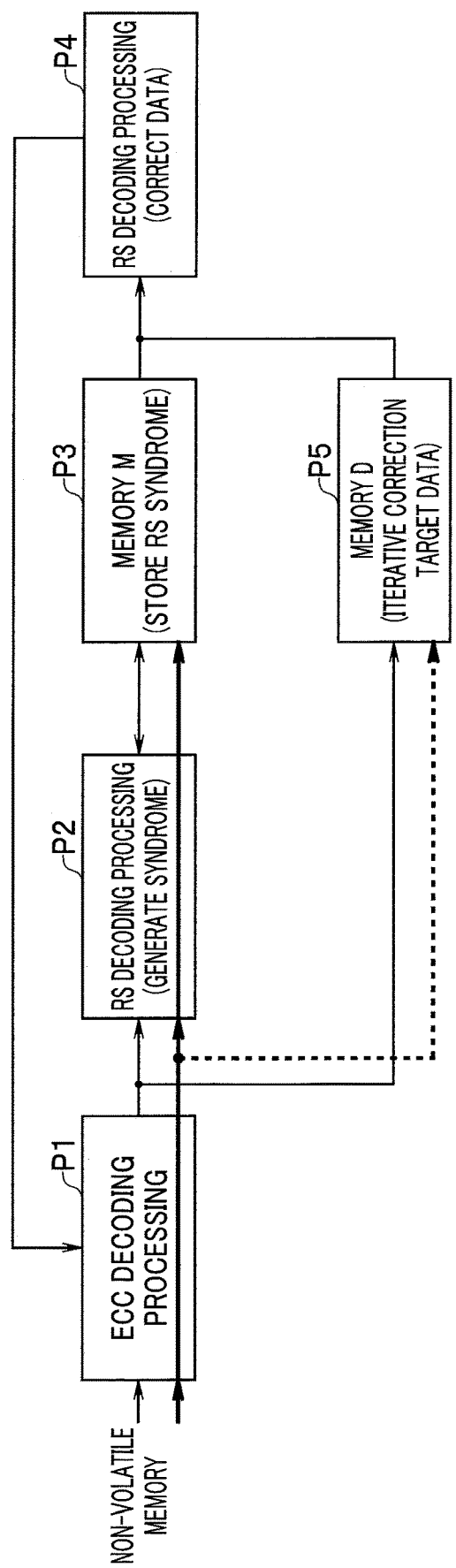
FIG. 9 is a circuit diagram illustrating data flow among circuits (processings) during the frame collection processing according to the comparative example.

FIG. 9 is a circuit diagram illustrating data flow among circuits (processings) during the above-described frame collection processing. At the ECC circuit 14, ECC decoding processing (P1) is executed on one piece of user data read out from the non-volatile memory 2 at the ECC decoding processing circuit.

After the ECC decoding processing (P1), an RS syndrome is generated from the data decoded through ECC and the RS syndrome in the memory M (P2), and the generated RS syndrome is stored in the memory M (P3). An ECC frame which has not been successfully decoded through ECC is stored in the memory D (P5).

As indicated with a solid line in FIG. 9, after the ECC decoding processing, an RS syndrome is generated from the ECC frame data and the RS syndrome in the memory M at the RS decoding processing circuit. The RS syndrome in the memory M is updated.

As indicated with a dotted line in FIG. 9, in a case where ECC correction has not been successful at the ECC decoding processing circuit, the ECC frame data for which ECC correction has been failed is written in the memory D.

Figure 10:
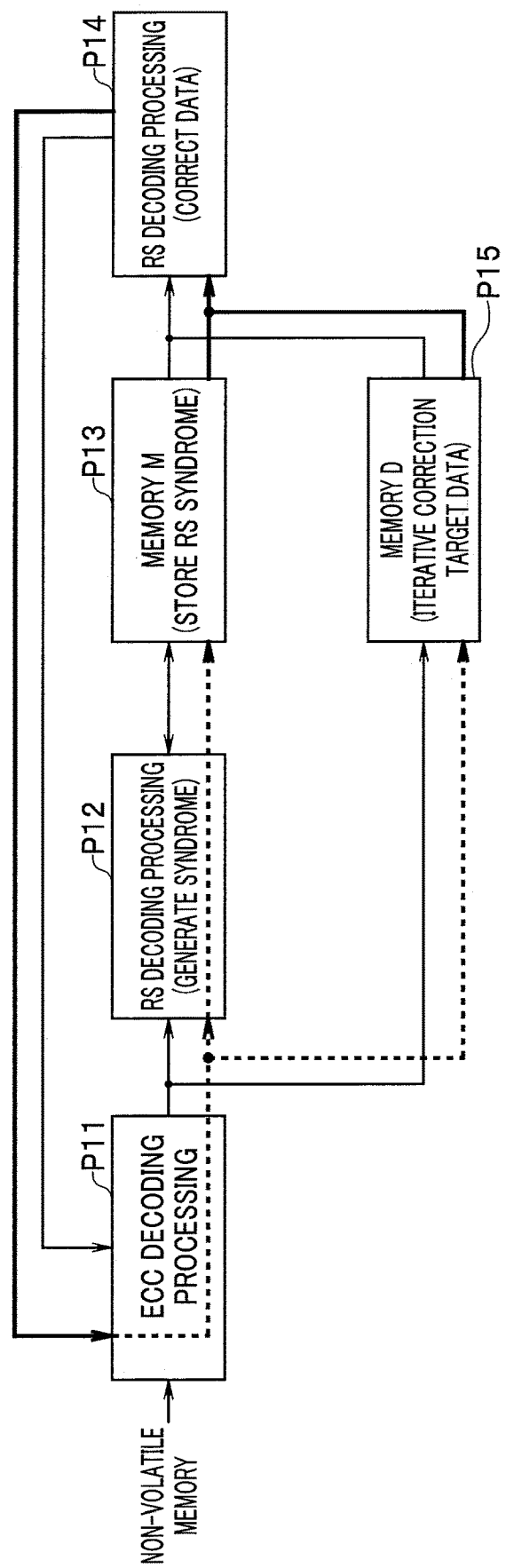
FIG. 10 is a circuit diagram illustrating data flow among circuits (processings) during the iterative correction processing according to the comparative example.

FIG. 10 is a circuit diagram illustrating data flow among circuits (processings) during the above-described iterative correction processing. As indicated with a solid line in FIG. 10, data of the ECC frame in the memory D is corrected through RS decoding using the RS syndrome in the memory M at the RS decoding processing circuit (P14).

After the RS decoding processing (P14), ECC decoding processing is executed on the ECC frame for which data has been corrected (P11). A syndrome is generated from the ECC frame which has been successfully decoded through ECC and the RS syndrome in the memory M (P12), and the generated RS syndrome is stored in the memory M (P13). Further, in a case where ECC decoding has been successful, data in the memory D is updated (P15).

As indicated with a dotted line in FIG. 10, in a case where ECC decoding processing has been successful, an RS syndrome is generated from the ECC frame data which has been successfully corrected through ECC and the RS syndrome in the memory M at the RS decoding processing circuit. The RS syndrome in the memory M is updated with the generated RS syndrome. Further, as indicated with a dotted line in FIG. 10, in a case where ECC decoding processing has been successful, data in the memory D is updated (ECC frame data for which ECC decoding has been failed is erased).

According to the decoding processing in the comparative example described above, ECC decoding processing is performed in a bit (column) direction in the frame collection processing. The processor 12 performs RS decoding processing (generates a syndrome) on data decoded through ECC, generates an RS syndrome and stores the RS syndrome in the memory M. Further, in a case where ECC decoding correction has been failed, the processor 12 stores data of the ECC frame in the memory D. The above-described processing is performed on N ECC frames.

In the iterative correction processing, the processor 12 performs RS decoding processing (corrects data) from the data which cannot be corrected through ECC decoding, and which is stored in the memory D in the frame collection processing, and the RS syndrome in the memory M. The processor 12 performs ECC decoding processing again on the data subjected to RS decoding. In a case where ECC decoding correction has been successful, the processor 12 stores (overwrites) the data decoded through ECC in the memory D, performs RS decoding processing (generates a syndrome) again, and updates (overwrites) the RS syndrome in the memory M.

The RS syndrome for N ECC frames is required for RS decoding processing (data correction) performed in this iterative correction. Thus, the RS syndrome stored in the memory M becomes a syndrome generated from a frame which has been successfully corrected through ECC decoding and a frame for which ECC decoding correction has been failed.

As a result, even if the ECC frame which could not be corrected through ECC decoding is tried to be decoded through ECC on the basis of a different determination level after the above-described iterative correction, it takes time to read out all the target ECC frames again, and thus, the ECC frame cannot be decoded through ECC on the basis of a different determination level.

For example, even if there is a possibility that the ECC frame can be decoded through ECC by changing setting of a level of error correction, the RS syndrome stored in the memory M is data based on the previous determination level, and thus, the RS syndrome in the memory M cannot be used for ECC decoding based on a different determination level.

As described above, to decode the ECC frame through ECC while changing setting of a determination level, it is necessary to read out all the target ECC frames again and generate a new RS syndrome, which is not realistic.

EMBODIMENT

The present embodiment enables ECC decoding based on a different determination level to be performed on the ECC frame which could not be corrected through ECC decoding without reading out all the target ECC frames and generating an RS syndrome, to decode the ECC frame which could not be corrected through ECC decoding, through ECC based on a different determination level.

Figure 11:
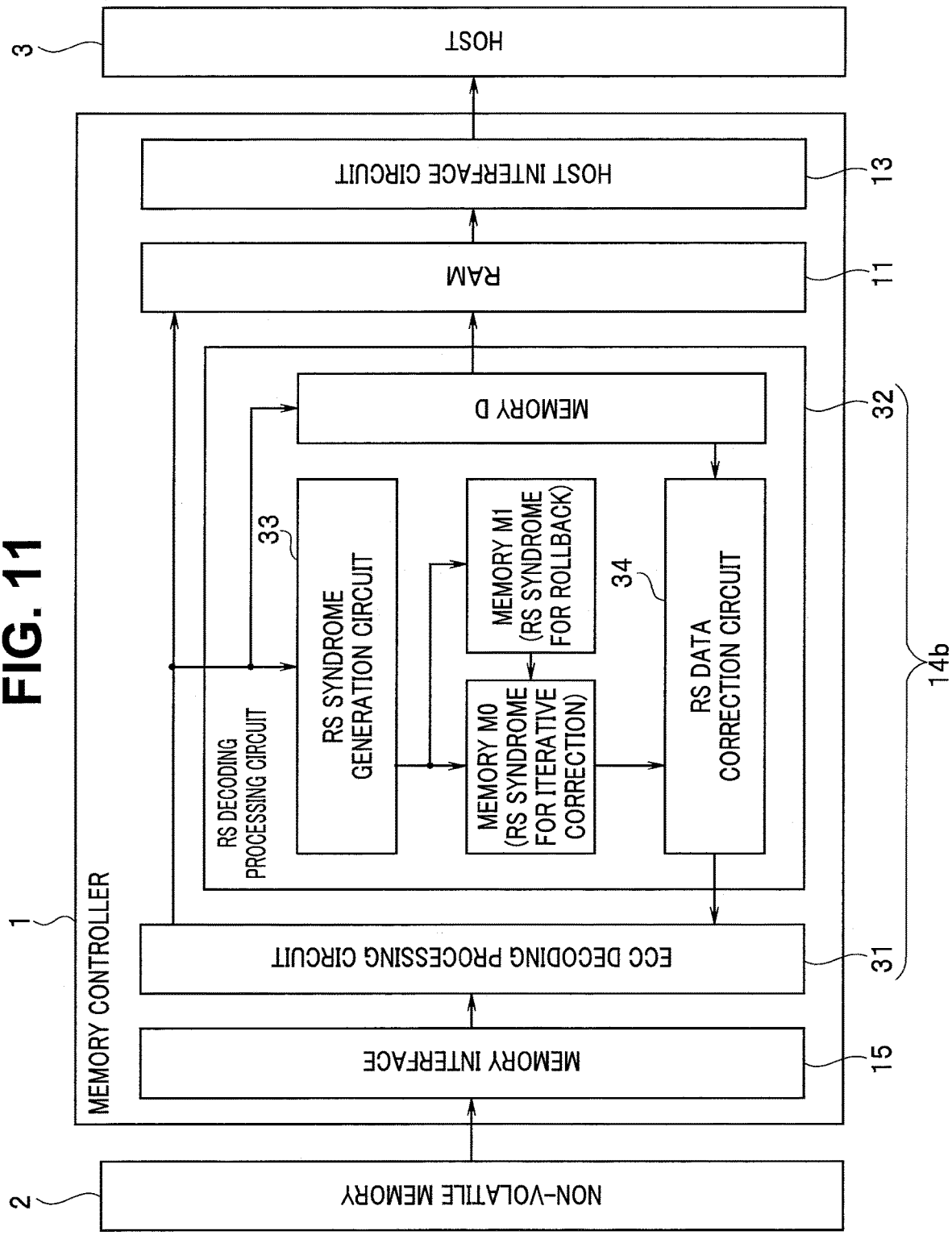
FIG. 11 is a configuration diagram of an error correction circuit of a memory controller according to the first embodiment.

FIG. 11 is a configuration diagram of the error correction circuit 14b of the memory controller 1 according to the present embodiment. The error correction circuit 14b includes an ECC decoding processing circuit 31 and an RS decoding processing circuit 32. Operation of the ECC decoding processing circuit 31 and the RS decoding processing circuit 32 is controlled by the processor 12.

The ECC decoding processing circuit 31 receives user data from the memory interface circuit 15 and executes ECC decoding processing. The product code frame includes user data to which error correction codes (ECC parity and RS parity) are added in a first direction (lateral direction) and a second direction (longitudinal direction). The ECC decoding processing circuit 31 is a decoding circuit which performs ECC decoding as first decoding on the ECC frame data in the first direction (lateral direction) of the product code frame.

The RS decoding processing circuit 32 is a decoding circuit which performs RS decoding on the RS frame data in the second direction (longitudinal direction) of the product code frame. The RS decoding processing circuit 32 includes a memory D, a memory M0, a memory M1, an RS syndrome generation circuit 33, and an RS data correction circuit 34. The RS syndrome generation circuit 33 calculates and generates an RS syndrome. The RS data correction circuit 34 corrects data using the RS syndrome.

The memory D stores the ECC frame for which data correction through ECC decoding has been failed. In other words, the memory D is a storage region which stores the ECC frame data for which ECC decoding has been failed at the ECC decoding processing circuit 31 as frame data which cannot be corrected through decoding.

The memory M0 is a storage region which stores an RS syndrome for iterative correction and corresponds to the memory M in the above-described comparative example. More specifically, the memory M0 is a storage region which stores a syndrome generated by RS decoding being performed on the ECC frame decoded through ECC at the RS decoding processing circuit 32 regardless of whether the ECC decoding has been successful or failed at the ECC decoding processing circuit 31.

The memory M1 stores an RS syndrome for rollback. More specifically, the memory M1 is a storage region which stores a syndrome generated for ECC frame data which has been successfully decoded through ECC at the ECC decoding processing circuit 31.

Note that while each of the memories D, M0 and M1 is a dedicated memory including an SRAM, and the like, the memories D, M0 and M1 may be storage regions of part of the RAM 11.

Figure 12:
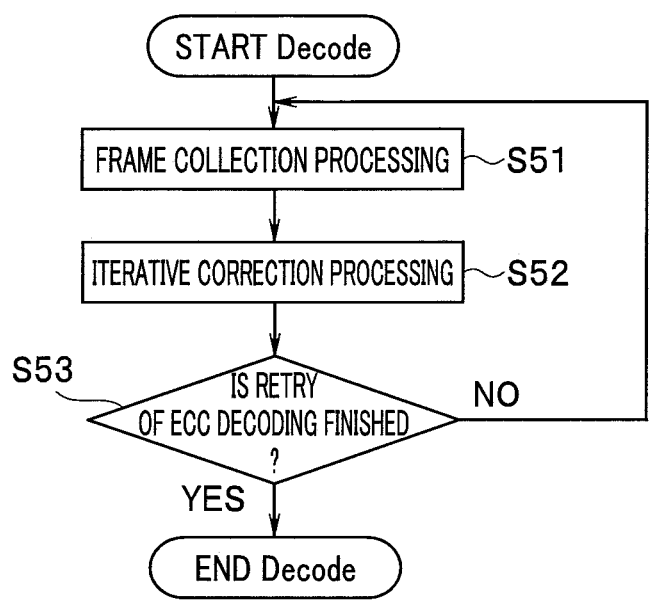
FIG. 12 is a flowchart illustrating entire flow of processing of decoding a product code frame of user data stored in a non-volatile memory according to the first embodiment.

FIG. 12 is a flowchart illustrating entire flow of processing of decoding a product code frame of user data stored in the non-volatile memory 2 according to the present embodiment.

In the decoding processing, first, the frame collection processing is performed (S51), and, then, the iterative correction processing is executed (S52). In the frame collection processing, frame data which cannot be corrected through decoding is collected, and in the iterative correction processing, RS decoding is performed on the frame data which cannot be corrected through decoding and which is collected in the frame collection processing. After the iterative correction processing, it is determined whether retry of ECC decoding in the frame collection processing is finished (S53), and in a case where retry of ECC decoding is not finished (S53: NO), the processing returns to S51. Whether retry of ECC decoding is finished is determined on the basis of whether or not predetermined conditions are satisfied. The predetermined conditions include, for example, whether a predetermined number of times of retry have been executed, whether ECC decoding of a predetermined determination level has been executed, and the like. In a case where retry of ECC decoding is finished (S53: YES), the processing is finished.

Figure 13:
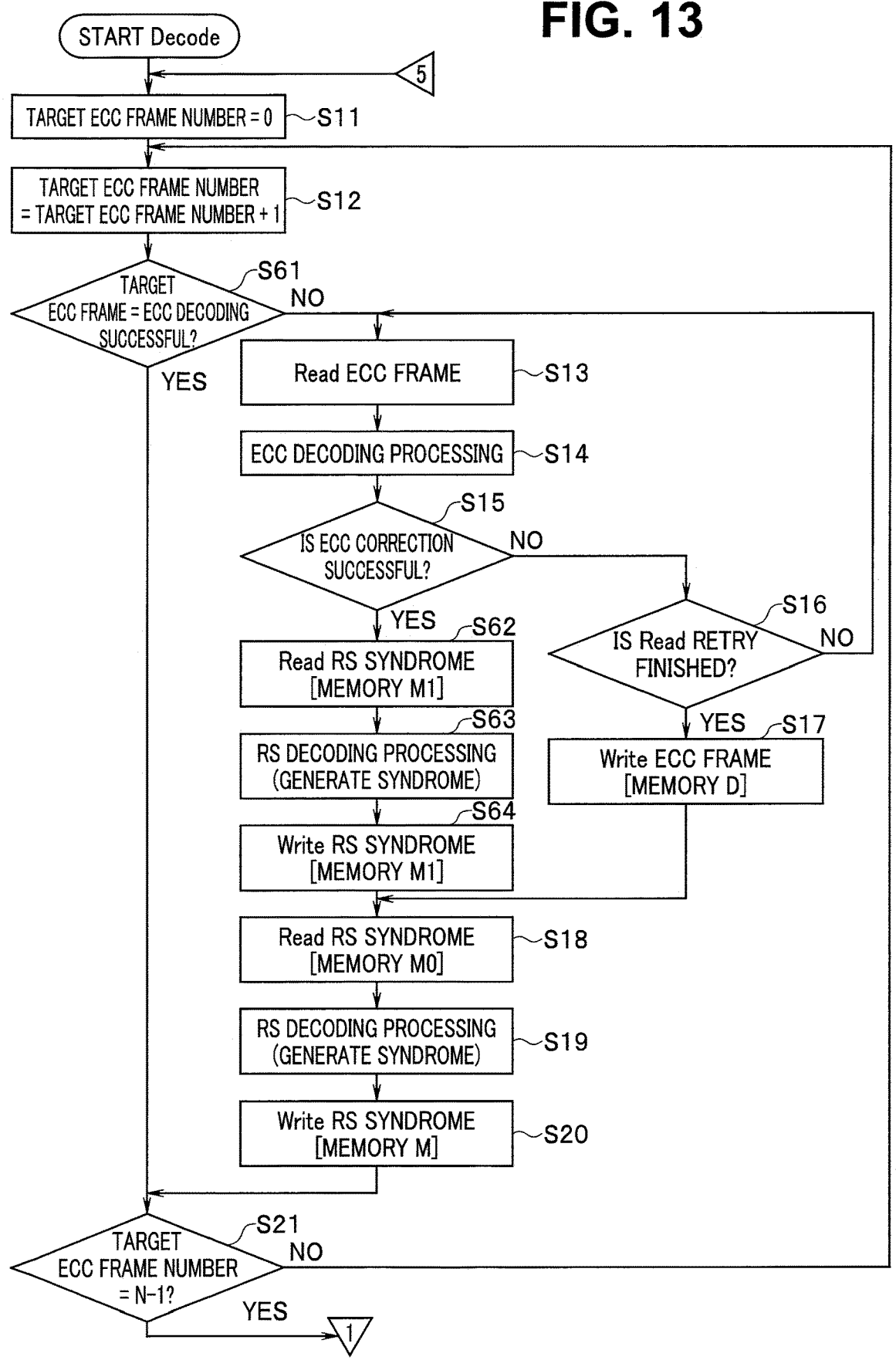
FIG. 13 is a flowchart illustrating an example of flow of frame collection processing according to the first embodiment.
Figure 14:
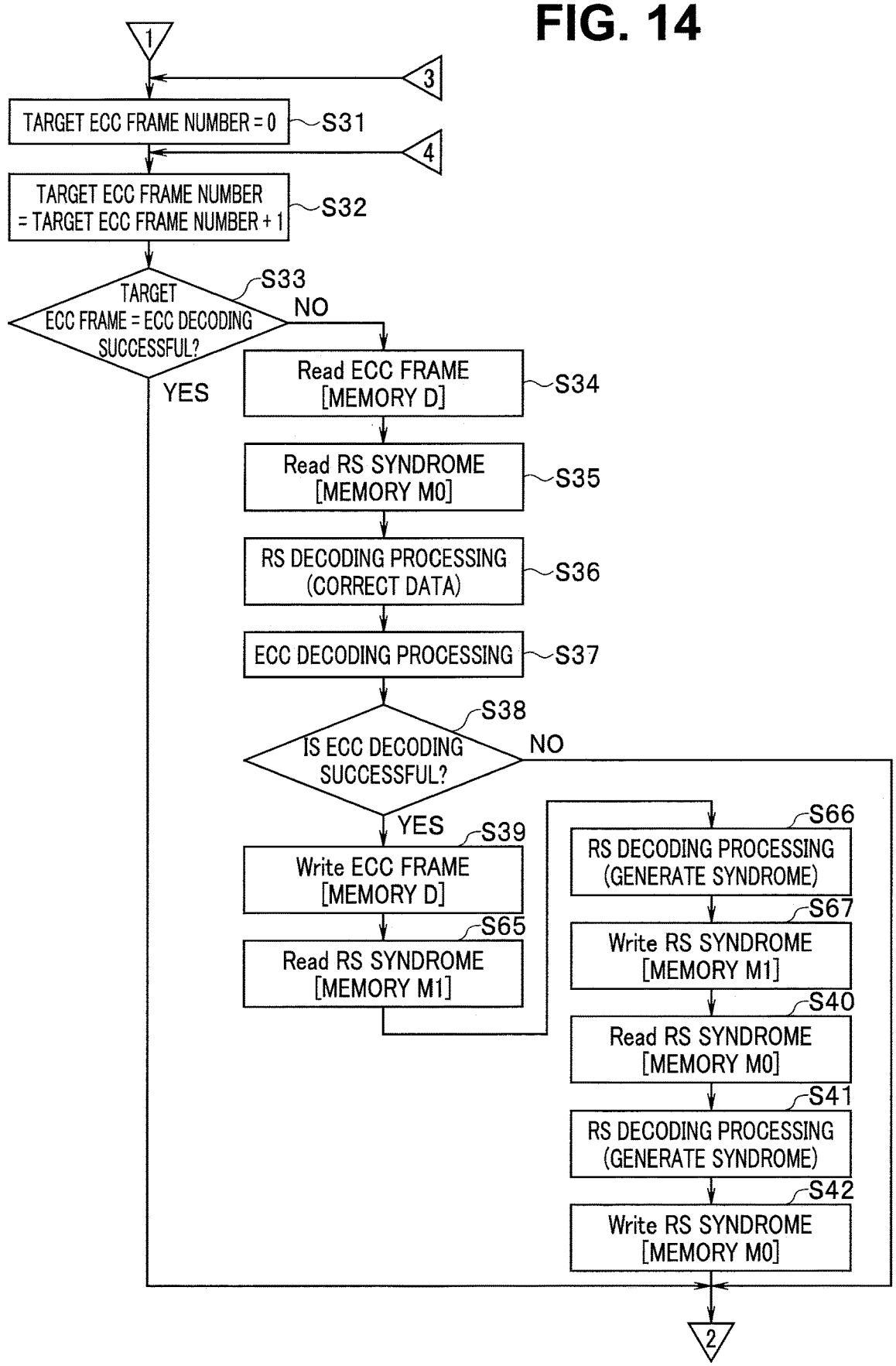
FIG. 14 is a flowchart illustrating an example of flow of iterative correction processing according to the first embodiment.
Figure 15:
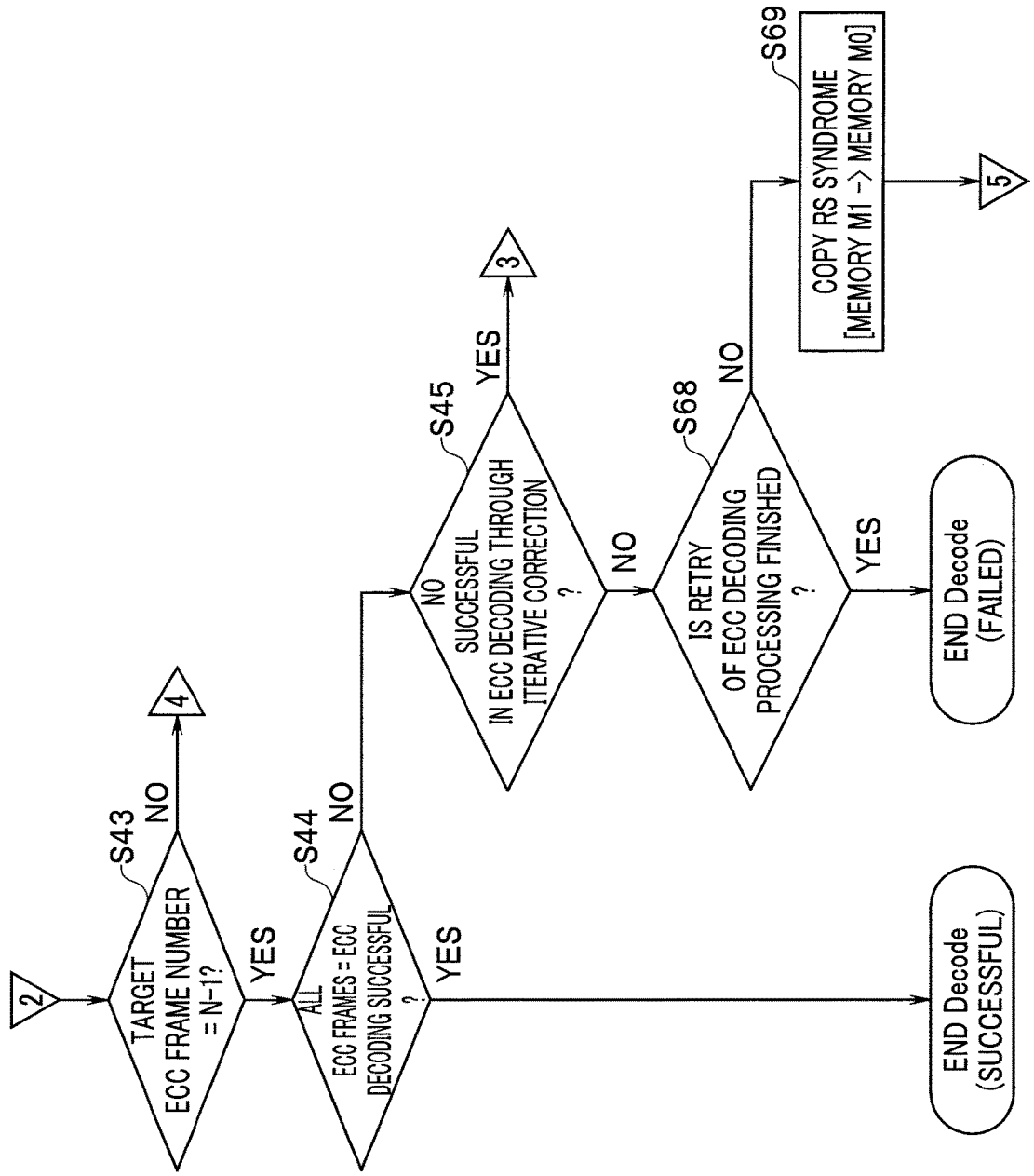
FIG. 15 is a flowchart illustrating an example of flow of the iterative correction processing according to the first embodiment.

FIG. 13 is a flowchart illustrating an example of flow of the frame collection processing according to the present embodiment. FIG. 14 and FIG. 15 are flowcharts illustrating an example of flow of the iterative correction processing according to the present embodiment. The same step numbers will be assigned to processing from FIG. 13 to FIG. 15, which is the same as the processing from FIG. 6 to FIG. 8, and the processing will be briefly described.

The processor 12 of the memory controller 1 sets a frame number of the target ECC frame which is a target of ECC at "0" (S11), and then, increments the frame number by "1" (S12).

The processor 12 determines whether the target ECC frame is a frame which has been successfully decoded through ECC on the basis of the frame number of the target ECC frame (S61).

In a case where the target ECC frame is a frame which has been successfully decoded through ECC (S61: YES), the processing transitions to S21.

In a case where the target ECC frame is not a frame which has been successfully decoded through ECC (S61: NO), the processor 12 reads out the target ECC frame of the set frame number (S13). After S13, the processor 12 executes ECC decoding processing by providing a signal for causing ECC decoding processing to be executed, to the error detection/correction circuit 14b (S14).

None of the target ECC frames is a frame which has been successfully decoded through ECC when each target ECC frame is read out for the first time, and thus, the determination result in S61 becomes NO.

After S14, the processor 12 reads out the target ECC frame of the set frame number (S13) and performs ECC decoding processing (S14).

The processor 12 determines whether the target ECC frame has been correctly read out or whether ECC correction by the error detection/correction circuit 14b has been successful in a case where the target ECC frame includes an error (S15).

In a case where ECC decoding has not been successful (S15: NO), the processor 12 determines whether a predetermined number of times of retry of readout have been finished (S16). In a case where the predetermined number of times of retry of readout have not been finished (S16: NO), the processing returns to S13, and the processing from S13 to S15 is executed again.

In a case where the predetermined number of times of retry of readout have been finished (S16: YES), the processor 12 writes the ECC frame which could not be corrected through ECC in the memory D (S17), and executes processing in S18 and subsequent processing.

In a case where ECC correction has been successful in S15, the processor 12 reads out the RS syndrome from the memory M1 (S62) and generates an RS syndrome for the RS decoding processing (S63). The processor 12 generates the RS syndrome (that is, updates the RS syndrome) by calculating an RS syndrome using the target ECC frame which has been successfully decoded and adding the calculated RS syndrome to the RS syndrome read out in S62 (S63). The processor 12 then writes the syndrome generated in S63 in the memory M1 (S64).

After the processor 12 writes the ECC frame which could not be corrected through ECC in the memory D in S17, and after S64, the processor 12 reads out the RS syndrome from the memory M0 (S18).

After S18, the processor 12 generates an RS syndrome for the RS decoding processing (S19). The processor 12 generates the RS syndrome (that is, updates the RS syndrome) by calculating an RS syndrome using the target ECC frame which has been decoded through ECC and adding the calculated RS syndrome to the RS syndrome read out in S18 (S19).

The processor 12 writes the syndrome generated in S19 in the memory M0 (S20).

As described above, in the frame collection processing, the processor 12 performs ECC decoding on the ECC frame data (S14), and in a case where ECC decoding has been successful (S15: YES), generates a syndrome for the ECC frame data which has been successfully decoded through ECC (S63) and stores the syndrome in the memory M1 (S64), and stores the syndrome generated for the ECC frame data in the memory M0 regardless of whether ECC decoding has been successful or failed (S20).

The processor 12 determines whether the target ECC frame number becomes (N−1) (S21). In other words, the processor 12 determines whether the above-described processing from S61 to S20 has been performed for all the ECC frames of N rows.

In a case where the processing from S61 to S20 has not been completed for the ECC frames of N rows, the processing returns to S12, the ECC frame number is incremented, and the processing in S61 and subsequent processing are executed.

In a case where the processing from S61 to S20 has been performed for all the ECC frames of N rows, the processor 12 executes the iterative correction processing in FIG. 14 and FIG. 15.

As described above, in a case where the processing in FIG. 13 is finished, information of the ECC frames for which data could not be corrected through ECC decoding is written in the memory D. Further, RS syndromes for all the target ECC frames are stored in the memory M0.

Further, RS syndromes for the target ECC frames which have been successfully corrected through ECC are stored in the memory M1. When readout of each target ECC frame is performed for the first time, an RS syndrome for the target ECC frame which has been successfully corrected through ECC is stored in the memory M1 upon the first readout.

In the iterative correction processing in FIG. 14 and FIG. 15, the processor 12 sets the frame number of the target ECC frame at "0" (S31) and increments the frame number by "1" (S32).

The processor 12 determines whether the target ECC frame is a frame which has been successfully decoded through ECC on the basis of the determination result data in S15 (S33).

In a case where the target ECC frame is a frame which could be decoded through ECC, that is, a frame which has been successfully decoded through ECC, the processing proceeds to S43, while, in a case where the target ECC frame is a frame which could not be decoded through ECC, the processing from S34 to S42 is executed.

In a case where the target ECC frame is a frame which could not be decoded through ECC, that is, a frame which has not been successfully decoded through ECC (S33: NO), the processor 12 reads out the ECC frame of the target ECC frame from the memory D (S34) and reads out the RS syndrome from the memory M0 (S35).

The processor 12 performs RS decoding processing, that is, data correction processing on the target ECC frame read out in S35 using the RS syndrome read out in S35 for the user data (S36). The target ECC frame read out in S34 may be corrected through the processing in S36, and thus, ECC decoding processing is executed on the target ECC frame (S37).

After S37, the processor 12 determines whether the target ECC frame has been successfully decoded through ECC as a result of the ECC decoding processing by the error detection/correction circuit 14b (S38). The processor 12 writes the determination result data in S38 in a predetermined storage region (or a predetermined register) within the RAM 11, that is, updates the determination result data.

In a case where the target ECC frame has been successfully decoded through ECC (S38: YES), the processor 12 writes the target ECC frame in the memory D (S39). The processor 12 reads out the RS syndrome from the memory M1 in a case where ECC decoding has been successful in S38, after the decoded target ECC frame is written in the memory D (that is, after the decoded target ECC frame is erased from the memory D) (S65).

The processor 12 generates an RS syndrome from the target ECC frame which has been successfully decoded and the RS syndrome in the memory M1 after S65. The processor 12 then writes the syndrome generated in S66 in the memory M1 (that is, updates the syndrome) (S67).

After S67, the processor 12 reads out the RS syndrome from the memory M0 (S40).

The processor 12 generates an RS syndrome from the target ECC frame which has been successfully decoded and the RS syndrome in the memory M0 after S40.

The processor 12 writes the syndrome generated in S41 in the memory M0 (that is, updates the syndrome) (S42).

The processor 12 determines whether the ECC frame number becomes (N−1) in a case where the determination result in S33 is YES, after S42 or in a case where the determination result in S38 is NO (S43). In other words, the processor 12 determines whether the above-described processing from S33 to S42 has been performed for all the ECC frames of N rows.

In a case where the processing from S33 to S42 has not been completed for the ECC frames of N rows, the processing returns to S32, the target ECC frame number is incremented, and the processing in S33 and subsequent processing are executed.

As described above, in the iterative correction processing, the processor 12 corrects data of the frame data which cannot be corrected through decoding, through RS decoding using the syndrome in the memory M0 (S36), performs ECC decoding on the frame data which cannot be corrected through decoding and which has been corrected through data correction (S37), and in a case where the frame data which cannot be corrected through decoding has been successfully decoded through ECC (S38: YES), updates (erases) the frame data which cannot be corrected through decoding in the memory D (S39), generates a syndrome for the frame data which cannot be corrected through decoding (S66), and updates the memory M0 and the memory M1 (S67).

In a case where the determination result in S43 is YES, that is, in a case where the processing from S33 to S42 has been performed for all the ECC frames of N rows, the processor 12 determines whether all the ECC frames have been successfully decoded through ECC (S44). The determination in S44 is performed by referring to the predetermined storage region (or the predetermined register) in the RAM 11 as described above.

In a case where ECC decoding has been successful for all the ECC frames (S44: YES), decoding processing is finished.

In a case where ECC decoding has not been successful for any one of the ECC frames (S44: NO), the processor 12 determines that none of the ECC frames has been successfully decoded through ECC in the above-described iterative correction processing from S31 to S43 (S45). The determination in S45 is performed on the basis of whether or not the determination result in S38 has become YES.

In a case where at least one ECC frame has been successfully decoded through ECC (S45: YES), the processing returns to S31, and the above-described processing is executed again. In other words, the user data could be decoded through ECC as a result of RS decoding, and thus, it is tried again whether ECC decoding is successful through RS decoding on the basis of the newly decoded user data. The processing from S31 to S43 is executed until, eventually, none of the ECC frames is decoded through ECC by iterative correction.

In a case where none of the ECC frames has been successfully decoded through ECC (S45: NO), the processor 12 determines whether retry of the ECC decoding processing in the frame collection processing is finished (S68). The determination processing in S68 corresponds to the processing in S53 in FIG. 12.

In a case where it is determined that retry of the ECC decoding processing is finished (S68: YES), the processing is finished. In a case where the processing is finished, a message, or the like, indicating that decoding processing has been failed is transmitted to the processor 12.

In a case where retry of the ECC decoding processing is not finished (S68: NO), the processor 12 copies the RS syndrome in the memory M1 to the memory M0 (S69). In other words, the processor 12 copies data in the memory M1 to the memory M0 when the processor 12 performs the frame collection processing after the iterative correction processing.

The processing returns to S11 in FIG. 13 after S69.

After the iterative correction processing, the processing returns to the frame collection processing, and ECC correction is performed again. In the second and subsequent ECC decoding processing, processing different from the previous ECC decoding processing, for example, ECC decoding based on a different determination level is executed.

For example, in the first frame collection processing, a determination level of 60-bit correction in LDPC coding is used, and in the second frame collection processing, a determination level of 120-bit correction in the LDPC coding is used to improve ECC correction capability.

Figure 16:
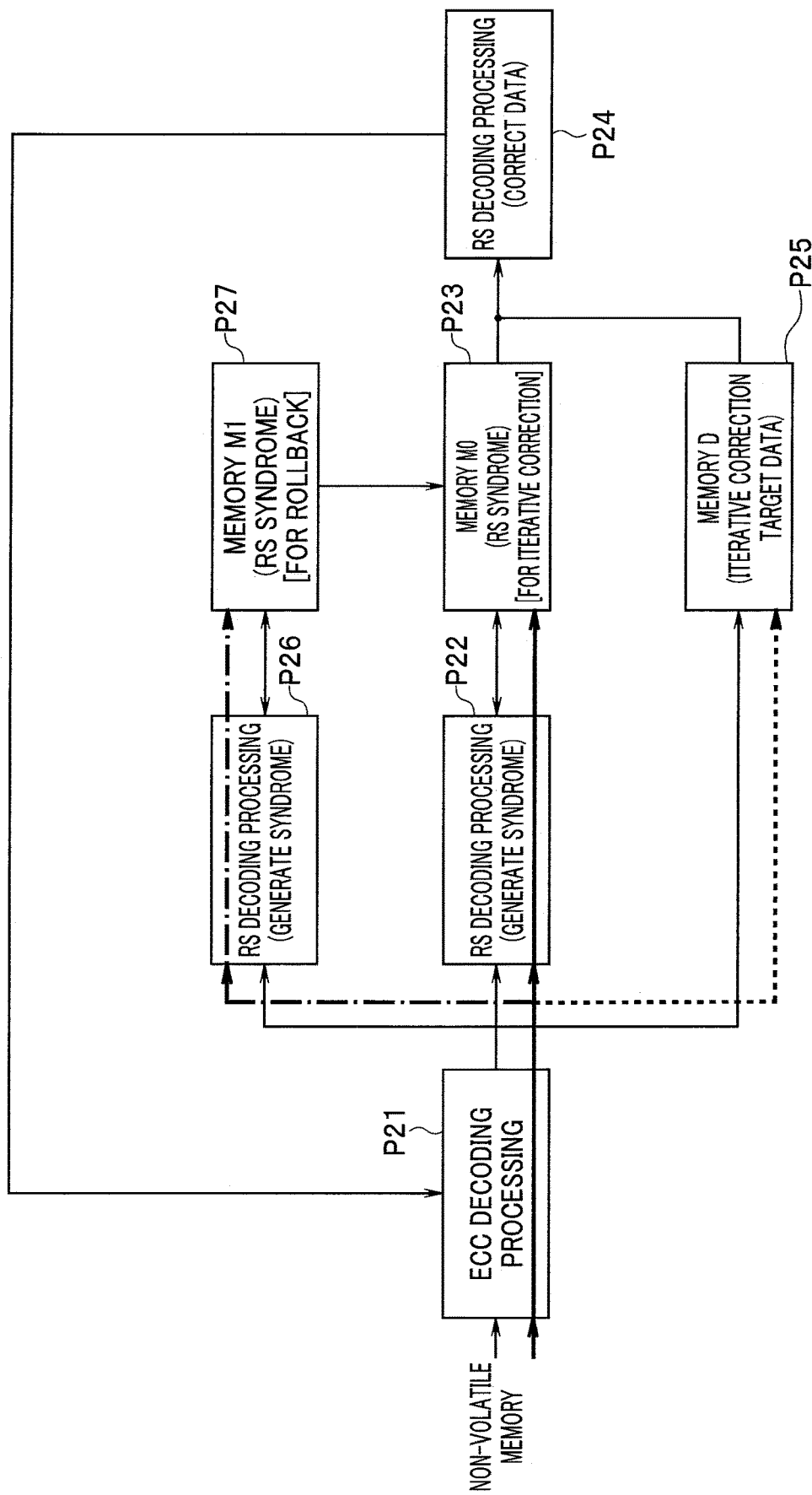
FIG. 16 is a circuit diagram illustrating data flow among a plurality of kinds of processing during the frame collection processing according to the first embodiment.

FIG. 16 is a circuit diagram illustrating data flow among a plurality of kinds of processing during the frame collection processing according to the present embodiment. At the ECC circuit 14, ECC decoding processing is executed on one piece of user data read out from the non-volatile memory 2 at the ECC decoding processing circuit (P21).

After the ECC decoding processing (P21), processing of generating an RS syndrome (P22) is executed (P22), and the generated RS syndrome is stored in the memory M0 (P23). Further, the ECC frame which has not been successfully decoded through ECC is stored in the memory D (P25).

An RS syndrome for rollback is generated for the ECC frame which has been successfully decoded through ECC (P26), and the generated RS syndrome is stored in the memory M1 (P27).

As indicated with a solid line in FIG. 16, after the ECC decoding processing, an RS syndrome is generated from the data which has been successfully corrected through ECC and the RS syndrome in the memory M0 at the RS decoding processing circuit (P22). The generated RS syndrome is stored in the memory M0 (P23).

As indicated with a dotted line in FIG. 16, in a case where ECC decoding has not been successful at the ECC decoding processing circuit, data of the ECC frame for which ECC correction has been failed is written in the memory D.

As indicated with a dashed-dotted line in FIG. 16, in a case where ECC decoding has been successful, a syndrome is generated from the data decoded through ECC and the syndrome in the memory M1, and stored in the memory M1.

The RS syndrome stored in the memory M0 is intended for computation, and the RS syndrome stored in the memory M1 is intended for rollback. The RS syndrome for rollback is generated only for data of the ECC frame which has been successfully decoded through ECC, and stored in the memory M1.

In the frame collection processing, in a case where ECC decoding correction has been successful, the RS syndrome for rollback in the memory M1 as well as the RS syndrome in the memory M0 is updated. Note that the RS syndrome for computation in the memory M0 is always updated regardless of whether ECC decoding has been successful or failed in a similar manner to the above-described comparative example.

Figure 17:
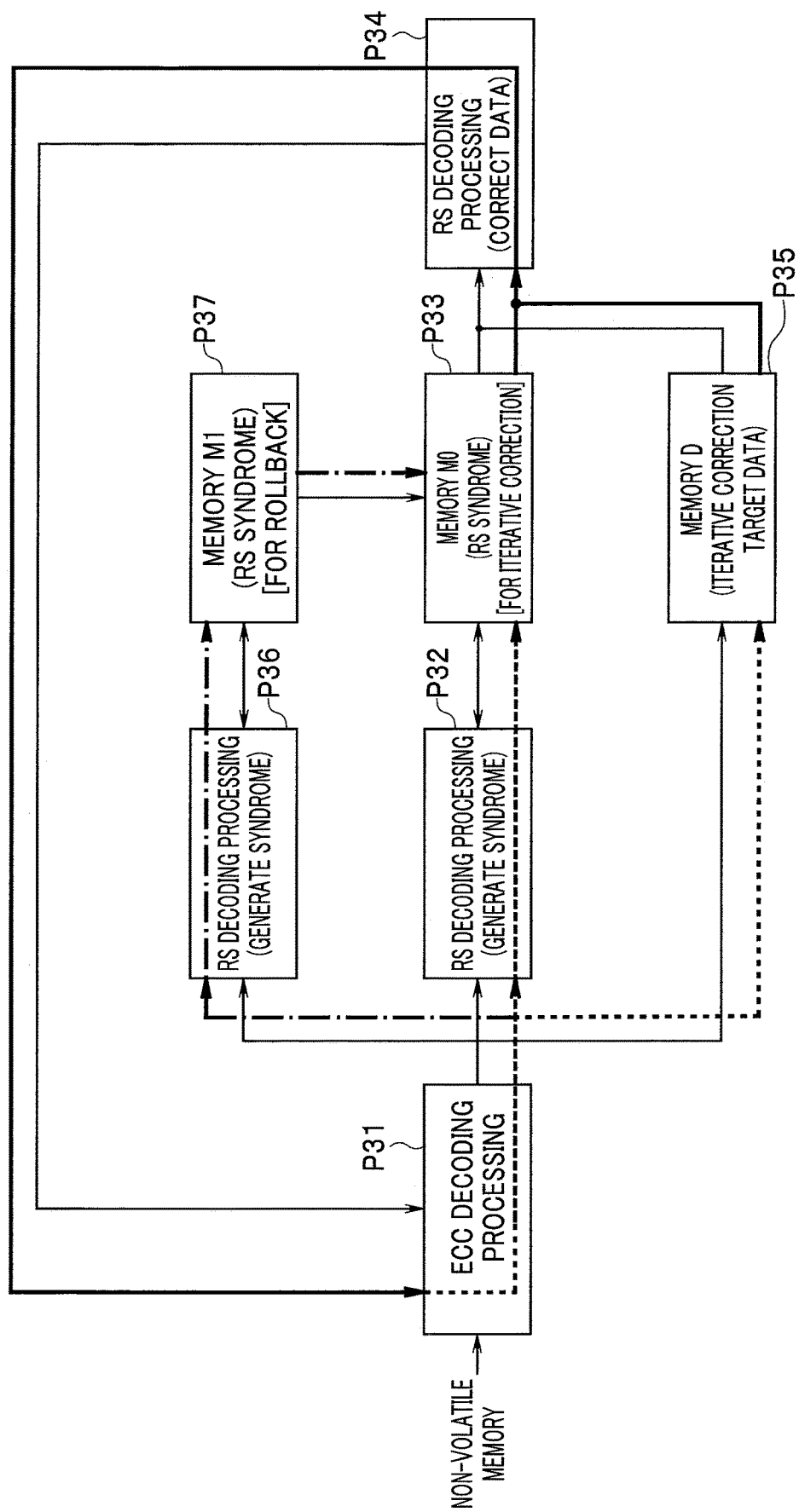
FIG. 17 is a circuit diagram illustrating data flow among circuits (processings) during the iterative correction processing according to the first embodiment.

FIG. 17 is a circuit diagram illustrating dataflow among circuits (processings) during the iterative correction processing according to the present embodiment. As indicated with a solid line in FIG. 17, at the RS decoding processing circuit, data of the ECC frame in the memory D is corrected using the RS syndrome in the memory M0 (P34). ECC decoding processing is executed on the target ECC frame for which data has been corrected at the RS decoding processing circuit (P31).

After the ECC decoding processing (P31), an RS syndrome for computation is generated from the data decoded through ECC and the RS syndrome in the memory M0 (P32), and the generated RS syndrome is stored in the memory M0 (P33). Further, an ECC frame which has not been successfully decoded through ECC is stored in the memory D (P35).

As indicated with a dotted line in FIG. 17, in a case where ECC decoding processing has been successful, an RS syndrome is generated from the data which has been successfully corrected through ECC and the RS syndrome in the memory M0 at the RS decoding processing circuit (P32). The generated RS syndrome is stored in the memory M0.

Further, as indicated with a dashed-dotted line in FIG. 17, in a case where ECC decoding processing has been successful, an RS syndrome is generated from the data which has been successfully decoded through ECC and the RS syndrome in the memory M1 (P36), and the generated RS syndrome is stored in the memory M1. In a case where none of the ECC frames has been successfully decoded through ECC in the iterative correction, the RS syndrome in the memory M1 is copied to the memory M0 to retry frame collection.

In the iterative correction, the RS syndrome for computation in the memory M0 is used to perform RS decoding processing (RS correction) and ECC decoding processing. In a case where ECC decoding correction has been successful, the RS syndrome for rollback in the memory M1 is also updated.

After the iterative correction is finished, frame collection can be performed again by rolling back the RS syndrome for computation by copying the RS syndrome for rollback in the memory M1 to the memory M0. This enables frame collection and iterative correction to be repeatedly performed, so that it is possible to improve correction capability in processing of decoding a product code.

Consequently, according to the present embodiment, it is possible to perform ECC decoding based on a different determination level without reading out all the target ECC frames again, so that it is eventually possible to provide a semiconductor device and a semiconductor storage device having higher error correction capability.

Second Embodiment

While in the first embodiment, two RS syndromes for performing decoding processing are stored and ECC decoding processing is repeatedly performed, in the second embodiment, ECC decoding processing is repeatedly performed without storing an RS syndrome for rollback by obtaining an RS syndrome of the ECC frame for which ECC decoding correction has been failed and subtracting the RS syndrome from the RS syndrome for computation, so that it is possible to implement a circuit while reducing a circuit scale.

A semiconductor storage device in the second embodiment has substantially the same configuration as the configuration in the first embodiment, and thus, description of the same components will be omitted using the same reference numerals, and only different components will be described.

Figure 18:
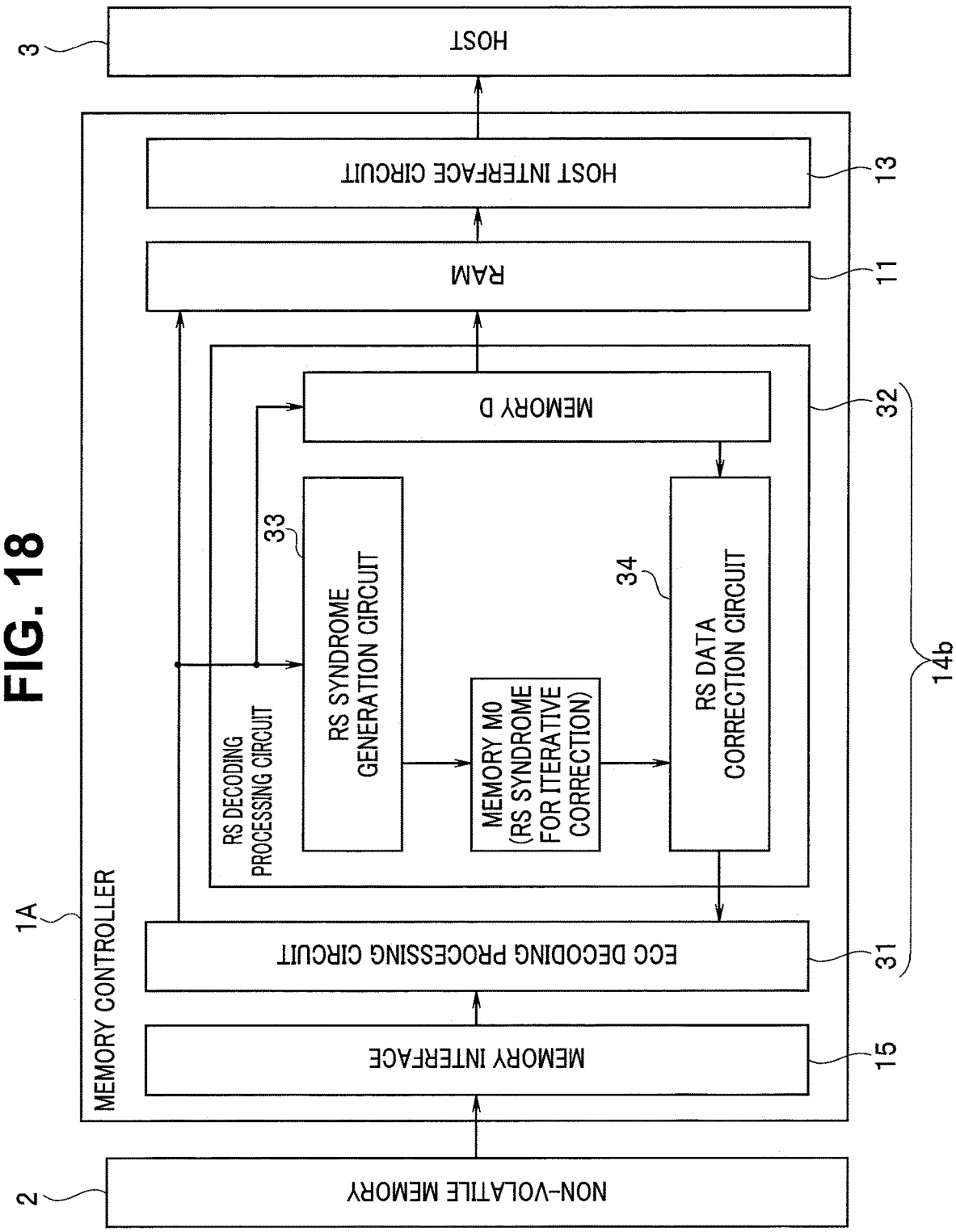
FIG. 18 is a configuration diagram of an error correction circuit of a memory controller according to a second embodiment.

FIG. 18 is a configuration diagram of an error correction circuit 14b of a memory controller 1A in the present embodiment. The memory controller 1A has the same configuration as the configuration of the memory controller 1 in FIG. 11 except that the memory controller 1A does not include the memory M1 of the memory controller 1 in FIG. 11.

Entire flow of processing of decoding a product code frame of user data stored in the non-volatile memory 2 in the present embodiment is the same as the flow illustrated in FIG. 12.

Frame collection processing in the present embodiment will be described first.

Figure 19:
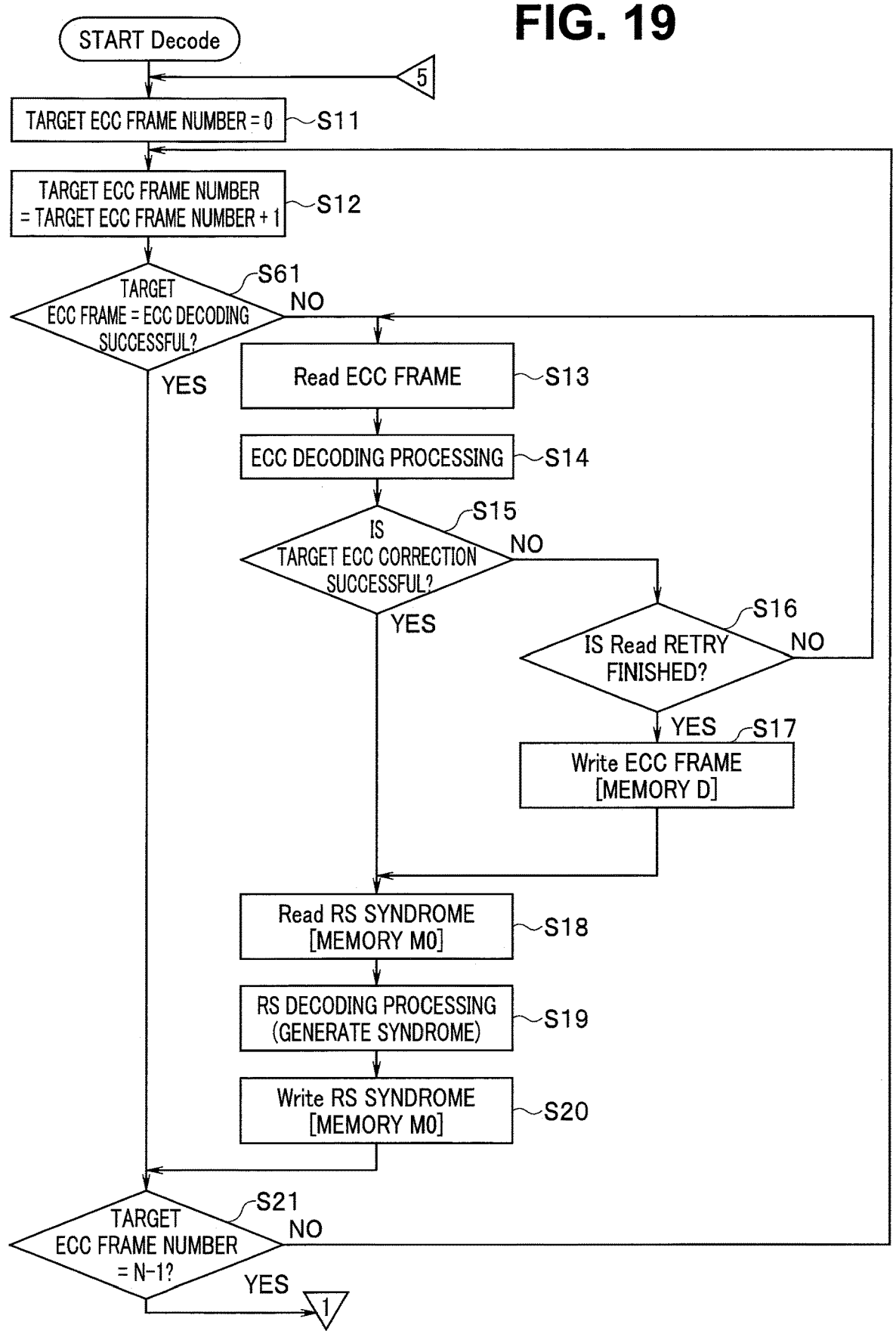
FIG. 19 is a flowchart illustrating an example of flow of frame collection processing according to the second embodiment.
Figure 20:
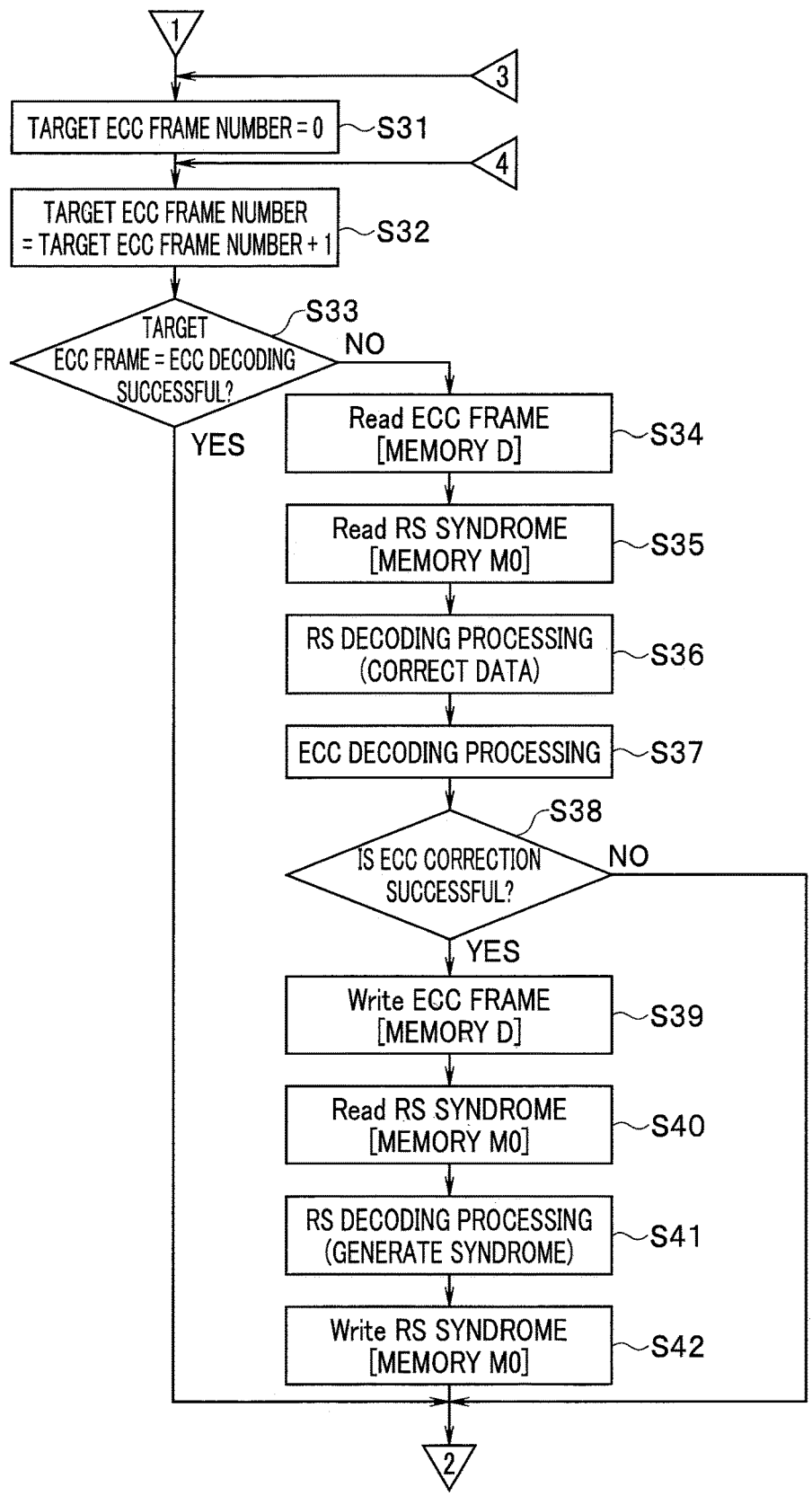
FIG. 20 is a flowchart illustrating an example of flow of iterative correction processing according to the second embodiment.
Figure 21:
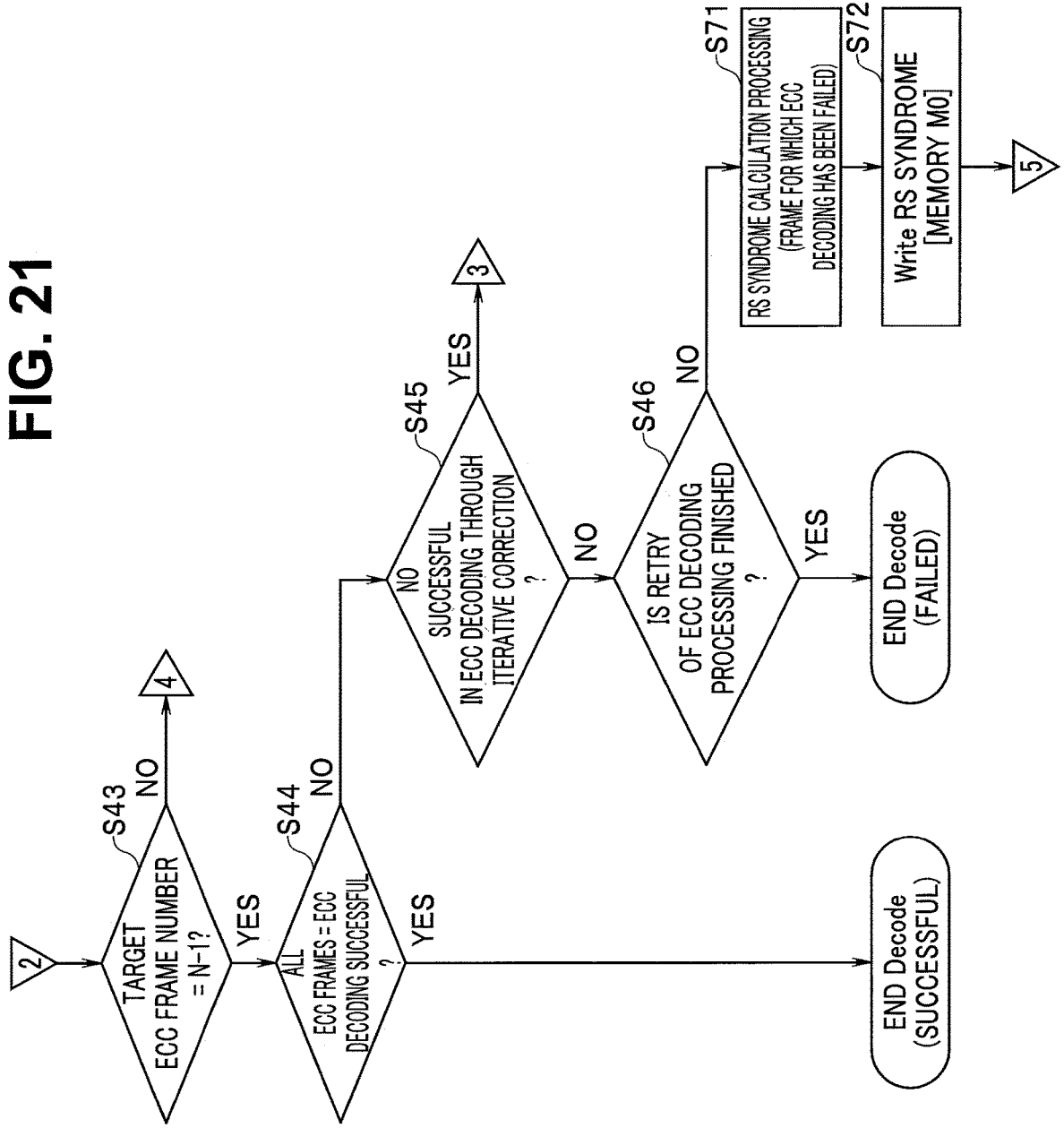
FIG. 21 is a flowchart illustrating an example of flow of the iterative correction processing according to the second embodiment.

FIG. 19 is a flowchart illustrating an example of flow of the frame collection processing according to the present embodiment. FIG. 20 and FIG. 21 are flowcharts illustrating an example of flow of iterative correction processing according to the present embodiment. The same step numbers will be assigned to processing from FIG. 19 to FIG. 21, which is the same as the processing from FIG. 6 to FIG. 8 and FIG. 13 to FIG. 15, and the processing will be briefly described.

The flow illustrated in FIG. 19 is different from the flow in the first embodiment in that the flow does not include the processing from S62 to S64 in FIG. 13. In the frame collection processing of the present embodiment, the processor 12 performs ECC decoding on the ECC frame data (S14), and stores a syndrome generated for the ECC frame data regardless of whether ECC decoding has been successful or failed in the memory M0 (S20).

In other words, in the frame collection processing, only storing and updating of the RS syndrome for computation in the memory M0 are performed, and storing and updating of the RS syndrome for rollback in the memory M1 in a case where ECC decoding correction has been successfully performed in the first embodiment are not performed. Note that the RS syndrome for computation in the memory M0 is always updated regardless of whether ECC decoding has been successful or failed in a similar manner to the first embodiment.

The flow illustrated in FIG. 20 is different from the flow in the first embodiment in that the flow does not include the processing from S65 to S67 in FIG. 14, and the flow illustrated in FIG. 21 is different from the flow in the first embodiment in that processing in S71 and S72 is executed in place of S69 in FIG. 15.

In the iterative correction processing of the present embodiment, the processor 12 corrects data of frame data which cannot be corrected through decoding, through RS decoding using the syndrome in the memory M0 (S36), performs ECC decoding on the frame data which cannot be corrected through decoding and which has been corrected through data correction (S37), and in a case where ECC decoding on the frame data which cannot be corrected through decoding has been successful (S38: YES), updates (erases) the frame data which cannot be corrected through decoding in the memory D (S39), generates a syndrome for the frame data which cannot be corrected through decoding (S41), and updates the memory M0.

More specifically, in the iterative correction processing, RS correction through RS decoding processing and ECC decoding processing are performed using the RS syndrome for computation in the memory M0. Then, in a case where frame collection is performed again (S46: NO) after the iterative correction is finished, the processor 12 updates the RS syndrome for computation in the memory M0 (S72) by obtaining an RS syndrome from a frame for which ECC decoding correction has been failed and subtracting the obtained RS syndrome from the RS syndrome for computation in the memory M0 (S71), and rolls back a state of the RS syndrome in the memory M0 to a state of only of a frame which has been successfully corrected through ECC decoding.

In other words, in a case where the frame collection processing is performed after the iterative correction processing, the processor 12 updates the memory M0 by subtracting the syndrome generated for the frame data which cannot be corrected through decoding and for which ECC decoding has been failed from the syndrome stored in the memory M0.

Figure 22:
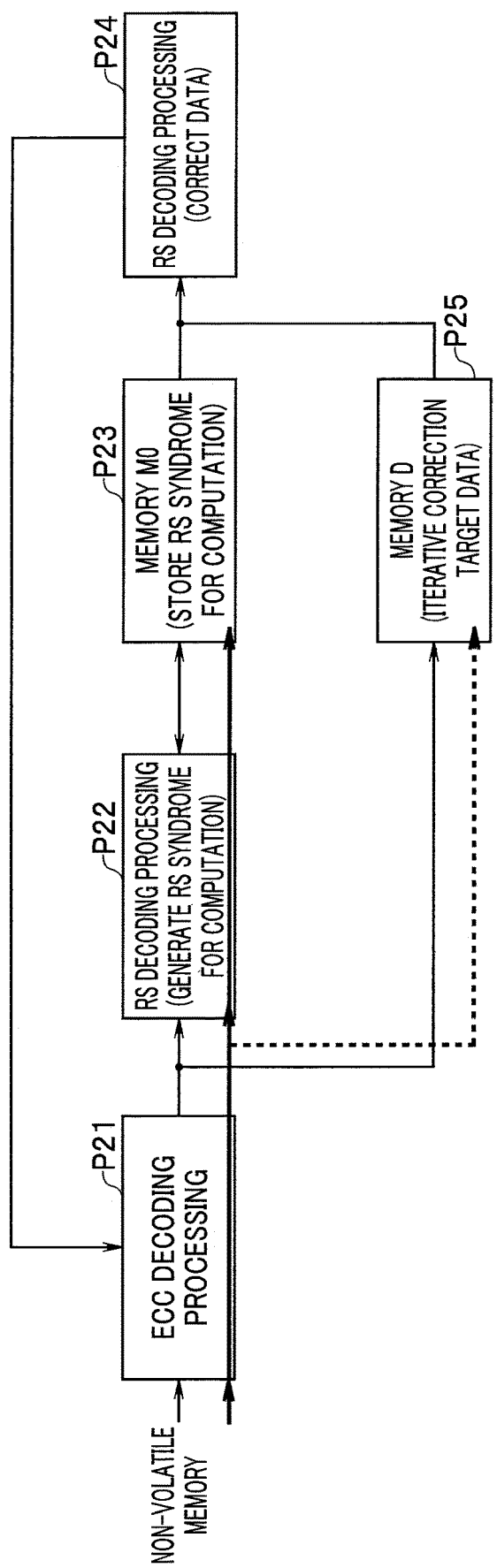
FIG. 22 is a circuit diagram illustrating data flow among circuits (processings) during the frame collection processing according to the second embodiment.

FIG. 22 is a circuit diagram illustrating data flow among circuits (processings) during the frame collection processing according to the present embodiment.

As indicated with a solid line in FIG. 22, after the ECC decoding processing (P21), an RS syndrome is generated from the data which has been successfully corrected through ECC and the RS syndrome in the memory M0 at the RS decoding processing circuit (P22). The generated RS syndrome is stored in the memory M0 (P23).

As indicated with a dotted line in FIG. 22, in a case where ECC correction has not been successful at the ECC decoding processing circuit, data of the ECC frame for which ECC correction has been failed is written in the memory D (P25).

Figure 23:
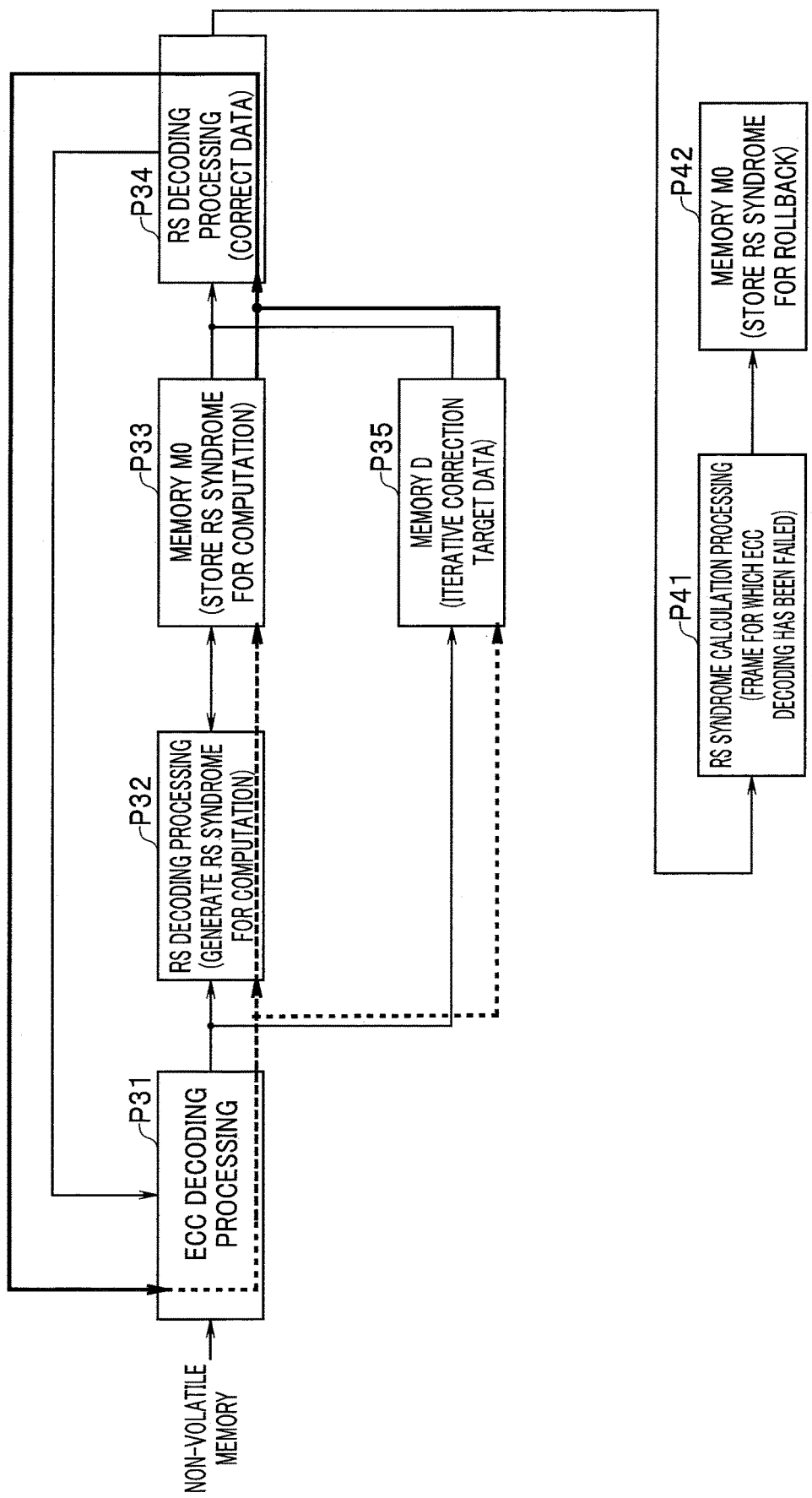
FIG. 23 is a circuit diagram illustrating data flow among circuits (processings) during the iterative correction processing according to the second embodiment.

FIG. 23 is a circuit diagram illustrating data flow among circuits (processings) during the iterative correction processing according to the present embodiment. As indicated with a solid line in FIG. 23, data of the ECC frame in the memory D is corrected using the RS syndrome in the memory M0 at the RS decoding processing circuit (P34). ECC decoding processing is executed on the target ECC frame for which data has been corrected at the RS decoding processing circuit (P31).

After the ECC decoding processing (P31), an RS syndrome for computation is generated from data which has been decoded through ECC and the RS syndrome in the memory M0 (P32), and the generated RS syndrome is stored in the memory M0 (P33). Further, an ECC frame which has not been successfully decoded through ECC is stored in the memory D (P35).

As indicated with a dotted line in FIG. 23, in a case where ECC decoding processing has been successful, an RS syndrome is generated from the data which has been successfully corrected through ECC and the RS syndrome in the memory M0 at the RS decoding processing circuit (P32). The generated RS syndrome is stored in the memory M0.

The processor 12 then subtracts the RS syndrome calculated from the ECC frame for which ECC decoding has been failed from the RS syndrome for computation (P41) and updates the RS syndrome for computation in the memory M0 (P42). Thereafter, the frame collection processing is executed again.

As described above, the present embodiment enables frame collection to be performed again after iterative correction by obtaining an RS syndrome of a frame for which ECC decoding correction has been failed and subtracting the RS syndrome from the RS syndrome for computation to roll back a state of the RS syndrome.

Compared to the first embodiment, the present embodiment eliminates the need for the memory M1 for storing an RS syndrome for the target ECC frame which has been successfully corrected through ECC, so that it is possible to reduce a circuit scale of the semiconductor device.

Consequently, according to the present embodiment, frame collection and iterative correction are repeatedly performed without the need for the memory M1 which stores an RS syndrome for rollback in the first embodiment, so that it is possible to achieve a semiconductor device and a semiconductor storage device having improved error correction capability.

According to the above-described respective embodiments, it is possible to provide a semiconductor device and a semiconductor storage device having improved error correction capability.

Particularly, according to the above-described respective embodiments, it is possible to perform frame collection processing again after iterative correction, so that it is possible to increase a possibility of correcting more errors.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor device comprising:
a first decoding circuit configured to perform first decoding on first frame data in a first direction of a product code frame;
a second decoding circuit configured to perform second decoding on second frame data in a second direction of the product code frame;
a first storage region in which a syndrome generated for the first frame data decoded at the first decoding circuit is stored;
a second storage region in which the syndrome generated for the first frame data for which the first decoding is successful at the first decoding circuit is stored; and
a third storage region in which the first frame data for which the first decoding is failed in the first decoding is stored as frame data which cannot be corrected through decoding,
wherein frame collection processing of collecting the frame data which cannot be corrected through decoding, and iterative correction processing of performing the second decoding on the frame data which cannot be corrected through decoding and which is collected in the frame collection processing, are executed,
in the frame collection processing, the first decoding is performed on the first frame data, in a case where the first decoding is successful, the syndrome is generated for the first frame data for which the first decoding is successful and stored in the second storage region, and the syndrome generated for the first frame data regardless of whether the first decoding is successful or failed is stored in the first storage region,
in the iterative correction processing, data correction is performed on the frame data which cannot be corrected through decoding, through the second decoding using the syndrome in the first storage region, the first decoding is performed on the frame data which cannot be corrected through decoding and which is corrected through the data correction, and in a case where the first decoding on the frame data which cannot be corrected through decoding is successful, the frame data which cannot be corrected through decoding in the third storage region is updated, and the syndrome is generated for the frame data which cannot be corrected through decoding to update the first storage region and the second storage region; and
in a case where the frame collection processing is performed after the iterative correction processing, data in the second storage region is copied to the first storage region.

2. The semiconductor device according to claim 1,
wherein in the first decoding, error correction is performed in units of bits, and
in the second decoding, error correction is performed in units of symbols.

3. The semiconductor device according to claim 2,
wherein the first decoding is LDPC decoding in which error correction is performed in the units of bits.

4. The semiconductor device according to claim 2,
wherein the second decoding is Reed-Solomon coding in which error correction is performed in the units of symbols.

5. The semiconductor device according to claim 4,
wherein the syndrome stored in the first storage region and the second storage region is a syndrome of the Reed-Solomon decoding.

6. The semiconductor device according to claim 1, further comprising:
an interface circuit configured to read out data from a storage device in which the product code frame is stored,
wherein the first decoding circuit and the second decoding circuit respectively perform the first decoding and the second decoding on the product code frame read out from the storage device via the interface circuit.

7. A semiconductor storage device comprising:
a semiconductor device; and
a storage device,
wherein the semiconductor device comprises:
a first decoding circuit configured to perform first decoding on first frame data in a first direction of a product code frame;
a second decoding circuit configured to perform second decoding on second frame data in a second direction of the product code frame;
a first storage region in which a syndrome generated for the first frame data decoded at the first decoding circuit is stored;
a second storage region in which the syndrome generated for the first frame data for which the first decoding is successful at the first decoding circuit is stored;
a third storage region in which the first frame data for which the first decoding is failed in the first decoding is stored as frame data which cannot be corrected through decoding; and
an interface circuit configured to read out data from the storage device in which the product code frame is stored,
the first decoding circuit and the second decoding circuit respectively perform the first decoding and the second decoding on the product code frame read out from the storage device via the interface circuit,
frame collection processing of collecting the frame data which cannot be corrected through decoding, and iterative correction processing of performing the second decoding on the frame data which cannot be corrected through decoding and which is collected in the frame collection processing, are executed,
in the frame collection processing, the first decoding is performed on the first frame data, and in a case where the first decoding is successful, the syndrome is generated for the first frame data for which the first decoding is successful and stored in the second storage region, and the syndrome generated for the first frame data regardless of whether the first decoding is successful or failed is stored in the first storage region, in the iterative correction processing, data correction is performed on the frame data which cannot be corrected through decoding, through the second decoding using the syndrome in the first storage region, the first decoding is performed on the frame data which cannot be corrected through decoding and which is corrected through the data correction, and in a case where the first decoding on the frame data which cannot be corrected through decoding is successful, the frame data which cannot be corrected through decoding in the third storage data is updated, and the syndrome is generated for the frame data which cannot be corrected through decoding to update the first storage region and the second storage region, and in a case where the frame collection processing is performed after the iterative correction processing, data in the second storage region is copied to the first storage region.

8. A semiconductor device comprising:

a first decoding circuit configured to perform first decoding on first frame data in a first direction of a product code frame;

a second decoding circuit configured to perform second decoding on second frame data in a second direction of the product code frame;

a first storage region in which a syndrome generated for the first frame data decoded at the first decoding circuit is stored; and a third storage region in which the first frame data for which the first decoding is failed in the first decoding is stored as frame data which cannot be corrected through decoding, wherein frame collection processing of collecting the frame data which cannot be corrected through decoding, and iterative correction processing of performing the second decoding on the frame data which cannot be corrected through decoding and which is collected in the frame collection processing, are executed, in the frame collection processing, the first decoding is performed on the first frame data, and the syndrome generated for the first frame data regardless of whether the first decoding is successful or failed is stored in the first storage region, in the iterative correction processing, data correction is performed on the frame data which cannot be corrected through decoding, through the second decoding using the syndrome in the first storage region, the first decoding is performed on the frame data which cannot be corrected through decoding and which is corrected through the data correction, and in a case where the first decoding on the frame data which cannot be corrected through decoding is successful, the frame data which cannot be corrected through decoding in the third storage region is updated, and the syndrome is generated for the frame data which cannot be corrected through decoding to update the first storage region, and in a case where the frame collection processing is performed after the iterative correction processing, a syndrome generated for the frame data which cannot be corrected through decoding and for which the first decoding is failed, is subtracted from the syndrome stored in the first storage region to update the first storage region.

9. The semiconductor device according to claim 8, wherein in the first decoding, error correction is performed in units of bits, and in the second decoding, error correction is performed in units of symbols.

10. The semiconductor device according to claim 9, wherein the first decoding is LDPC decoding in which error correction is performed in the units of bits.

11. The semiconductor device according to claim 9, wherein the second decoding is Reed-Solomon coding in which error correction is performed in the units of symbols.

12. The semiconductor device according to claim 11, wherein the syndrome stored in the first storage region is a syndrome of the Reed-Solomon decoding.

13. The semiconductor device according to claim 8, further comprising:

an interface circuit configured to read out data from a storage device in which the product code frame is stored, wherein the first decoding circuit and the second decoding circuit respectively perform the first decoding and the second decoding on the product code frame read out from the storage device via the interface circuit.

14. A semiconductor storage device comprising:

a semiconductor device; and a storage device, wherein the semiconductor device comprises:

a first decoding circuit configured to perform first decoding on first frame data in a first direction of a product code frame;

a second decoding circuit configured to perform second decoding on second frame data in a second direction of the product code frame;

a first storage region in which a syndrome generated for the first frame data decoded at the first decoding circuit is stored;

a third storage region in which the first frame data for which the first decoding is failed in the first decoding is stored as frame data which cannot be corrected through decoding; and an interface circuit configured to read out data from the storage device in which the product code frame is stored, wherein the first decoding circuit and the second decoding circuit respectively perform the first decoding and the second decoding on the product code frame read out from the storage device via the interface circuit, frame collection processing of collecting the frame data which cannot be corrected through decoding, and iterative correction processing of performing the second decoding on the frame data which cannot be corrected through decoding and which is collected in the frame collection processing, are executed, in the frame collection processing, the first decoding is performed on the first frame data, and the syndrome generated for the first frame data regardless of whether the first decoding is successful or failed is stored in the first storage region, in the iterative correction processing, data correction is performed on the frame data which cannot be corrected through decoding, through the second decoding using the syndrome in the first storage region, the first decoding is performed on the frame data which cannot be corrected through decoding and which is corrected through the data correction, and in a case where the first decoding on the frame data which cannot be corrected through decoding is successful, the frame data which cannot be corrected through decoding in the third storage region is updated, and the syndrome is generated for the frame data which cannot be corrected through decoding to update the first storage region, and in a case where the frame collection processing is performed after the iterative correction processing, a syndrome generated for the frame data which cannot be corrected through decoding and for which the first decoding is failed, is subtracted from the syndrome stored in the first storage region to update the first storage region.

* * * * *